(12) United States Patent
Enomoto et al.

(10) Patent No.: US 7,816,067 B2
(45) Date of Patent: Oct. 19, 2010

(54) COATING-TYPE UNDERLAYER COATING FORMING COMPOSITION FOR LITHOGRAPHY CONTAINING NAPHTHALENE RESIN DERIVATIVE

(75) Inventors: Tomoyuki Enomoto, Toyama (JP); Takahiro Kishioka, Toyama (JP); Takahiro Sakaguchi, Toyama (JP)

(73) Assignee: Nissan Chemical Industries, Ltd., Tokyo (JP)

( * ) Notice: Subject to any disclaimer, the term of this patent is extended or adjusted under 35 U.S.C. 154(b) by 418 days.

(21) Appl. No.: 11/921,790

(22) PCT Filed: May 24, 2006

(86) PCT No.: PCT/JP2006/310358

§ 371 (c)(1),
(2), (4) Date: Dec. 7, 2007

(87) PCT Pub. No.: WO2006/132088

PCT Pub. Date: Dec. 14, 2006

(65) Prior Publication Data

US 2009/0053647 A1    Feb. 26, 2009

(30) Foreign Application Priority Data

Jun. 10, 2005    (JP)    ............... 2005-170758

(51) Int. Cl.
G03F 7/11    (2006.01)
G03F 7/20    (2006.01)
G03F 7/30    (2006.01)
G03F 7/36    (2006.01)
C08G 59/00    (2006.01)

(52) U.S. Cl. ................ 430/270.1; 430/271.1; 430/311; 430/313; 430/317; 430/325; 430/326; 528/366; 528/105; 528/97

(58) Field of Classification Search ........................ None
See application file for complete search history.

(56) References Cited

U.S. PATENT DOCUMENTS 5,693,691 A    12/1997    Flaim et al.

5,919,599 A    7/1999    Meador et al.

FOREIGN PATENT DOCUMENTS

| JP | 62-25116 A | * | 2/1987 |
|----|------------|---|--------|
| JP | A 11-511194 | | 9/1999 |
| JP | A 2002-14474 | | 1/2002 |
| JP | A 2004-205685 | | 7/2004 |

OTHER PUBLICATIONS

English abstract for JP 62-25116, provided by JPO.*
Lynch et al., "Properties and Performance of Near UV Reflectivity Control Layers," *Proceedings of SPIE*, vol. 2195, pp. 225-229, (1994).
Taylor et al., "Methacrylate Resist and Antireflective Coatings for 193 nm Lithography," *Proceedings of SPIE*, vol. 3678, pp. 174-185 (1999).
Meador et al., "Recent Progress in 193 nm Antireflective coatings," *Proceedings of SPIE*, vol. 3678, pp. 800-809 (1999).

* cited by examiner

*Primary Examiner*—Sin J. Lee
(74) *Attorney, Agent, or Firm*—Oliff & Berridge, PLC

(57) ABSTRACT

To provide a coating-type underlayer coating forming composition containing a naphthalene resin derivative.

A coating-type underlayer coating forming composition for lithography comprising a compound of formula (1):

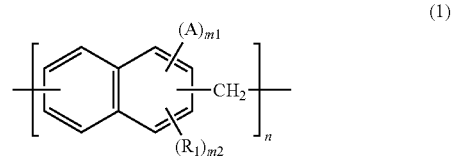

(1)

wherein A is an organic group having an aromatic group, $R_1$ is hydroxy group, an alkyl group, an alkoxy group, a halogen group, a thiol group, an amino group or an amide group, m1 is the number of A substituted on the naphthalene ring and is an integer of 1 to 6, m2 is the number of $R_1$ substituted on the naphthalene ring and is an integer of 0 to 5, a sum of m1 and m2 (m1+m2) is an integer of 1 to 6, in cases where the sum is an integer other than 6, the reminder is hydrogen atom, and n is the number of repeating units ranging from 2 to 7000.

12 Claims, No Drawings

US 7,816,067 B2

COATING-TYPE UNDERLAYER COATING FORMING COMPOSITION FOR LITHOGRAPHY CONTAINING NAPHTHALENE RESIN DERIVATIVE

TECHNICAL FIELD

The present invention relates to a coating-type underlayer coating forming composition for lithography that is effective on processing of semiconductor substrates, and a method for forming photoresist pattern by use of the coating-type underlayer coating forming composition.

BACKGROUND ART

Conventionally, in the manufacture of semiconductor devices, micro-processing by lithography using a photoresist composition has been carried out. The micro-processing is a processing method comprising forming a thin film of a photoresist composition on a substrate to be processed, such as a silicon wafer or the like, irradiating actinic rays such as ultraviolet rays through a mask pattern on which a pattern for a semiconductor device is depicted, developing it to obtain a photoresist pattern, and etching the substrate to be processed by use of the photoresist pattern as a protective film. However, in recent progress in high integration of semiconductor devices, there has been a tendency that shorter wavelength actinic rays are being used, i.e., ArF excimer laser beam (193 nm) has been taking the place of KrF excimer laser beam (248 nm). Along with this change, influences of random reflection and standing wave of actinic rays from a substrate have become serious problems. Accordingly, it has been widely studied to provide an anti-reflective coating between the photoresist and the substrate to be processed (Bottom Anti-Reflective Coating, BARC).

As the anti-reflective coating, inorganic anti-reflective coatings made of titanium, titanium dioxide, titanium nitride, chromium oxide, carbon or α-silicon, etc., and organic anti-reflective coatings made of a light absorbing substance and a high molecular compound are known. The former requires an installation such as a vacuum deposition apparatus, a CVD (chemical vapor deposition) apparatus or a sputtering apparatus, etc. In contrast, the latter is considered advantageous in that it requires no special installation so that many studies have been made. For example, mention may be made of a novolak resin type anti-reflective coating and an acrylic resin type anti-reflective coating which have a hydroxyl group being a crosslinking reaction group and a light absorbing group in the same molecule (see, for example Patent Documents 1 and 2).

The physical properties desired for organic anti-reflective coating materials include high absorbance to light and radioactive rays, no intermixing with a layer applied on the anti-reflective coating (being insoluble in a solvent used for materials applied on the anti-reflective coating), no diffusion of low molecular substances from the anti-reflective coating materials into the topcoat resist on applying or drying with heat, and a higher dry etching rate than the photoresist (see, for example, Non-patent Documents 1, 2 and 3).

When miniaturization of resist pattern progresses in future, problems such as a low resolution and collapse of resist pattern after development occur, and thus it is desired to make photoresists thinner. Therefore, it is difficult to obtain a film thickness of resist pattern sufficient for the processing of substrates, and processes for providing a function as a mask in the substrate processing not only for resist pattern but also for coating-type underlayer coating formed between a resist and a semiconductor substrate to be processed become required. As the coating-type underlayer coating for such a process, a coating-type underlayer coating for lithography having a selection ratio of dry etching rate close to that of photoresists, a coating-type underlayer coating for lithography having a lower selection ratio of dry etching rate than that of photoresists, or a coating-type underlayer coating for lithography having a lower selection ratio of dry etching rate than that of semiconductor substrates, which is different from conventional high etch rate coating-type underlayers, becomes required. It is also able to confer anti-reflective performance to the coating-type underlayer coatings, and they can have the function of the conventional anti-reflective coatings together.

On the other hand, for obtaining fine resist pattern, it begins to use a process in which the resist pattern and the coating-type underlayer coating are made thinner on dry etching of coating-type underlayer coating than the width of pattern on the development of photoresists. As the coating-type underlayer coating for such a process, a coating-type underlayer coating having a selection ratio of dry etching rate close to that of photoresists which is different from conventional high etch rate anti-reflective coatings, becomes required. It is also able to confer anti-reflective performance to the coating-type underlayer coatings, and they can have the function of the conventional anti-reflective coatings together.

Patent Document 1: U.S. Pat. No. 5,919,599

Patent Document 2: U.S. Pat. No. 5,693,691

Non-patent Document 1: Tom Lynch et al., "Properties and Performance of Near UV Reflectivity Control Layers", US, in Advances in Resist Technology and Processing XI, Omkaram Nalamasu ed., Proceedings of SPIE, 1994, Vol. 2195, p. 225-229

Non-patent Document 2: G. Taylor et al., "Methacrylate Resist and Antireflective Coatings for 193 nm Lithography", US, in Microlithography 1999: in Advances in Resist Technology and Processing XVI, Will Conley ed., Proceedings of SPIE, 1999, Vol. 3678, p. 174-185 Non-patent Document 3: Jim D. Meador et al., "Recent Progress in 193 nm Antireflective Coatings, US, in Microlithography 1999: in Advances in Resist Technology and Processing XVI, Will Conley ed., Proceedings of SPIE, 1999, Vol. 3678, p. 800-809

DISCLOSURE OF INVENTION

Problem to be solved by the Invention

An object of the present invention is to provide a coating-type underlayer coating forming composition that is used for lithography process in the production of semiconductor devices. Another object of the present invention is to provide a coating-type underlayer coating for lithography having a selection ratio of dry etching rate close to that of photoresists, a coating-type underlayer coating for lithography having a lower selection ratio of dry etching rate than that of photoresists, or a coating-type underlayer coating for lithography having a lower selection ratio of dry etching rate than that of semiconductor substrates, that causes no intermixing with photoresist layers and provides excellent photoresist pattern. In addition, the present invention can confer a property for absorbing effectively reflection light from substrates in a case where irradiation light having a wavelength of 248 nm, 193 nm, 157 nm or the like is used in the micro-processing. Further, an object of the present invention is to provide a method for forming a photoresist pattern, in which the coating-type underlayer coating forming composition is used.

Means for Solving the Problem

Taking the above-mentioned present status into account, the present inventors eagerly investigated, and as a result, they found the use of a naphthalene resin derivative having naphthalene derivative in the main chain makes possible to form a coating-type underlayer coating for lithography having a selection ratio of dry etching rate close to that of photoresists, a coating-type underlayer coating for lithography having a lower selection ratio of dry etching rate than that of photoresists, or a coating-type underlayer coating for lithography having a lower selection ratio of dry etching rate than that of semiconductor substrates, to confer an function as anti-reflective coating, and to control refractive Index n and attenuation coefficient k in 248 nm, 193 nm or 157 nm of the composition therefor, and they completed the present invention.

The present invention relates to the following aspects:

as a first aspect, a coating-type underlayer coating forming composition for lithography comprising a compound of formula (1):

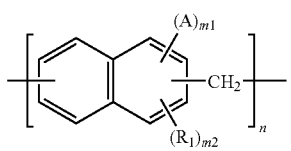

(1)

wherein A is an organic group having an aromatic group, $R_1$ is hydroxy group, an alkyl group, an alkoxy group, a halogen group, a thiol group, an amino group or an amide group, m1 is the number of A substituted on the naphthalene ring and is an integer of 1 to 6, m2 is the number of $R_1$ substituted on the naphthalene ring and is an integer of to 5, a sum of m1 and m2 (m1+m2) is an integer of 1 to 6, in cases where the sum is an integer other than 6, the reminder is hydrogen atom, and n is the number of repeating units ranging from 2 to 7000;

as a second aspect, a coating-type underlayer coating forming composition for lithography comprising a compound of formula (2):

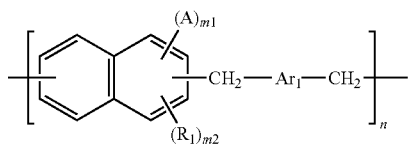

(2)

wherein A, $R_1$, m1, m2, and n are as defined in formula (1), $Ar_1$ is a substituted or unsubstituted aromatic group;

as a third aspect, a coating-type underlayer coating forming composition for lithography comprising a compound of formula (3):

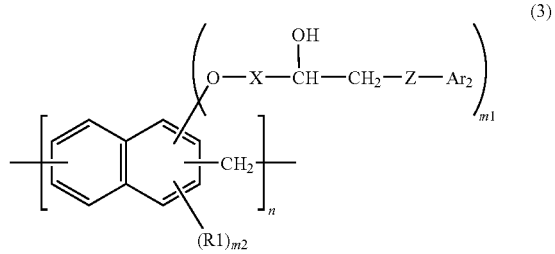

(3)

wherein X is a single bond, methylene group, $C_{2-10}$alkylene group, a divalent hydrocarbon group having $C_{2-10}$ether bond, or carbonyl group, Z is a linking group of —O— or —OC(=O)—, $Ar_2$ is an unsubstituted aromatic ring or an aromatic ring substituted with carboxylic acid, a carboxylic acid ester group, hydroxy group, an alkyl group, an alkoxy group, sulfonic acid group, or a halogen group, and $R_1$, m1, m2 and n are as defined in formula (1);

as a fourth aspect, a coating-type underlayer coating forming composition for lithography comprising a compound of formula (4):

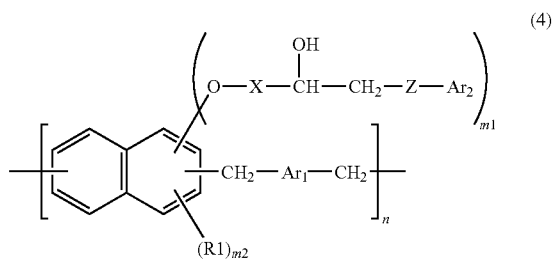

(4)

wherein X and Z are as defined in formula (3), $Ar_1$ is as defined in formula (2), $Ar_2$ is as defined in formula (3), and $R_1$, m1, m2, and n are as defined in formula (1);

as a fifth aspect, a coating-type underlayer coating forming composition for lithography comprising a compound of formula (5):

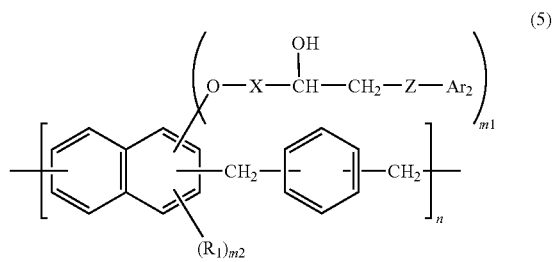

(5)

wherein X and Z are as defined in formula (3), $Ar_2$ is as defined in formula (3), and $R_1$, m1, m2 and n are as defined in formula (1);

as a sixth aspect, the coating-type underlayer coating forming composition for lithography as described in any one of the first to fifth aspects, further comprising a crosslinking compound;

as a seventh aspect, the coating-type underlayer coating forming composition for lithography as described in any one of the first to fifth aspects, further comprising an acid, an acid generator, or both of them:

as an eighth aspect, the coating-type underlayer coating forming composition for lithography as described in the sixth aspect, further comprising an acid, an acid generator, or both of them;

as a ninth aspect, a coating-type underlayer coating for lithography obtained by coating the coating-type underlayer coating forming composition as described in any one of the first to fifth aspects on a semiconductor substrate and baking it;

as a tenth aspect, a method for forming photoresist pattern for use in manufacture of semiconductor device, comprising coating the coating-type underlayer coating forming composition as described in any one of the first to fifth aspects on a semiconductor substrate, and baking it to form a coating-type underlayer coating;

as an eleventh aspect, a method for manufacturing semiconductor device comprising the steps of:

forming a coating-type underlayer coating from the coating-type underlayer coating forming composition as described in any one of the first to fifth aspects;

forming a resist coating on the coating-type underlayer coating;

forming a resist pattern by exposure to light and development;

etching the coating-type underlayer coating by use of the resist pattern; and processing the semiconductor substrate by use of the patterned coating-type underlayer coating; and as a twelfth aspect, a method for manufacturing semiconductor device comprising the steps of forming a coating-type underlayer coating from the coating-type underlayer coating forming composition as described in any one of the first to fifth aspects;

forming a hardmask on the coating-type underlayer coating;

forming a resist coating further thereon;

forming a resist pattern by exposure to light and development;

etching the hardmask by use of the resist pattern;

etching the coating-type underlayer coating by use of the patterned hardmask; and processing the semiconductor substrate by use of the patterned coating-type underlayer coating.

Effect of the Invention

The present invention relates to a coating-type underlayer coating formed by use of a resin having a naphthalene derivative in the main chain, and a coating-g-type underlayer coating forming composition for forming the coating-type underlayer coating.

The coating-type underlayer coating forming composition of the present invention can form a good pattern shape of photoresists without intermixing of the coating-type underlayer coating with the part applied thereon.

It is possible to confer a property for inhibiting effectively reflection from substrates on the coating-type underlayer coating forming composition of the present invention, and thus the coating-type underlayer coating can combine an effect as antireflective coating.

The coating-type underlayer coating forming composition of the present invention can provide excellent coating-type underlayer coatings that have a selection ratio of dry etching rate close to that of photoresists, a lower selection ratio of dry etching rate than that of photoresists, or a lower selection ratio of dry etching rate than that of semiconductor substrates.

In order to prevent collapse of resist pattern after development with miniaturization of resist pattern, it is performed to make photoresists thinner. The thin resists are required to be subjected to a process in which the resist pattern is transferred to the sublayer by etching process, and the substrate processing is performed by use of the sublayer as a mask, and a process in which the step comprising transferring the resist pattern to the sublayer by etching process, and transferring the pattern transferred to the sublayer to the layer applied below the sublayer with a different gas composition is repeated, and finally the substrate processing is performed. The coating-type underlayer coating and the composition for forming the same according to the present invention are effective for these processes. When the substrate processing is performed by use of the coating-type underlayer coating of the present invention, the coating-type underlayer coating has an etching resistance sufficiently for processing substrates (for example thermal silicon oxide coating, silicon nitride coating, polysilicon coating or the like on a substrate).

On the other hand, for obtaining fine resist pattern, it begins to be also used a process in which the resist pattern and the coating-type underlayer coating are made thinner on dry etching of coating-type underlayer coating than the width of pattern on the development of photoresists. The coating-type underlayer coating and the composition for forming the same according to the present invention are effective for this process, and has a selection property of dry etching rate close to that of photoresists.

Further, the coating-type underlayer coating of the present invention can be used as a planarizing (flattening) coating, a resist underlayer coating, an anti-contamination coating of photoresist layer, or a coating having a dry etching selectivity. The coating-type underlayer coating makes possible to form photoresist pattern in lithography process of the manufacture of semiconductor devices in an easy and precise manner.

BEST MODE FOR CARRYING OUT THE INVENTION

The coating-type underlayer coating forming composition of the present invention comprises at least one of a naphthalene resin having the structural unit of formula (1) and a naphthalene resin having the structural unit of (2), and further a solvent. Further, the coating-type underlayer coating for lithography of the present invention comprises a crosslinking agent, a crosslinking catalyst, and a surfactant, etc. as arbitrary components. The coating-type underlayer coating for lithography of the present invention contains a solid content being all components except the solvent in an amount of 0.1 to 70% by weight, preferably 0.5 to 50% by weight, further preferably 1 to 40% by weight. In the solid content, the naphthalene derivative of formula (1) or the naphthalene derivative of formula (2) is contained in an amount of 5 to 100% by weight, preferably 7 to 95% by weight, further preferably 10 to 90% by weight. The naphthalene resin having the structural unit represented by formula (1) or (2) in the present invention can be used as a light absorbing compound on patterning of photoresists. The naphthalene compound in the present invention has a high absorption for light at photosensitive characteristic wavelength region of photosensitive components in a photoresist layer provided on an anti-reflective coating, and prevent standing wave caused by reflection from a substrate or random reflection due to unevenness on the substrate surface.

The naphthalene resin having the structural unit represented by formula (1) or (2) is an oligomer or a polymer in which the repeating unit n is 2 to 7000, or 2 to 5000, or 2 to 300. The molecular weight thereof varies depending on the application solvent used, solution viscosity, film shape or the like, but ranges from 400 to 1000000, preferably 500 to 500000, further preferably 500 to 300000 in weight average molecular weight.

The naphthalene resin having the structural unit represented by formula (1) or (2) has substituent (A). That is, the resin is a naphthalene novolak resin having side chain (A) having an aromatic ring or a hetero-aromatic ring at the end. In addition, the structural unit of formula (1) can have substituent ($R_1$) consisting of hydroxy group, $C_{1-4}$alkyl group, $C_{1-4}$alkoxy group and a halogen group such as bromine atom, the number m1 of substituent A on the naphthalene ring is 1 to 6, and the number m2 of substituent ($R_1$) is 0 to 5, the total number of substituent A and substituent ($R_1$) per naphthalene ring is 1 to 6 (m1+m2=1 to 6), and in cases where the total number is an integer other than 6, the reminder is hydrogen atom.

The compound of formula (3) is a specific polymer among those of formula (1). In formula (3), X in substituent (A) is a single bond, methylene group, $C_{2-10}$alkylene group, a divalent hydrocarbon group having $C_{2-10}$ether bond, or carbonyl group, Z is a linking group of —O— or —OC(=O)—, $Ar_2$ is an unsubstituted aromatic ring or an aromatic ring substituted with carboxylic acid, a carboxylic acid ester group, hydroxy group, an alkyl group, an alkoxy group, sulfonic acid group, a halogen group, thiol group, amino group, or amide group. The aromatic ring ($Ar_2$) includes benzene ring, naphthalene ring, anthracene ring, or heterocyclic ring thereof containing hetero atom such as nitrogen atom or the like.

The unit of formula (1) includes further the resin of formula (2) having a novolak structure of a naphthalene derivative with other aromatic compound. In formula (2), the other aromatic compound ($Ar_1$) constituting a novolak structure with a naphthalene derivative includes for example benzene, naphthalene, anthracene, or derivative thereof containing hetero atom such as nitrogen atom or the like, or derivative thereof obtained by substituting the above-mentioned compound with carboxylic acid, a carboxylic acid ester group, hydroxy group, an alkyl group, an alkoxy group, sulfonic acid group, a halogen group, thiol group, amino group, or amide group. Among them, the compound corresponding to formula (5) in which ($Ar_1$) is benzene is preferable. The compound of formulae (1) and (2) can be produced by subjecting naphthalene hydroxide and acetaldehyde to condensation polymerization to produce a naphthalene resin, reacting the naphthalene resin with epichlorohydrin to produce a naphthalene resin having glycidyl ether group, and reacting the resulting naphthalene resin with carboxylic acid or hydroxide of benzene, naphthalene or anthracene. Both ends of the compounds of formulae (1) and (2), the compounds of formulae (3) to (5) being specific compounds thereof, and exemplified compounds thereof can have hydrogen atom or hydroxy group.

For the above-mentioned production methods, known conditions for production can be applied. For example, the reaction condition for obtaining novolak comprises a reaction at a temperature of 50 to 180° C. for 4 to 72 hours by use of a catalyst such as oxalic acid or the like in the presence or absence of a solvent such as N-methylpyrrolidone or the like. The reaction condition for obtaining glycidyl ether comprises a reaction at a temperature of 50 to 180° C. for 4 to 72 hours by use of a catalyst such as benzyl triethyl ammonium chloride or the like in a solvent such as propylene glycol monomethyl ether or the like, and further a reaction at a temperature of 50 to 180° C. for 4 to 72 hours by use of a catalyst such as sodium hydroxide or the like in the presence or absence of a solvent such as propylene glycol monomethyl ether or the like. The condition for the reaction of glycidyl ether group with an aromatic carboxylic acid or hydroxide comprises a reaction at a temperature of 50 to 180° C. for 4 to 72 hours by use of a catalyst such as benzyl triethyl ammonium chloride or the like in a solvent such as propylene glycol monomethyl ether or the like. The present invention is not limited to these production methods, and the intended compound can be produced by combining a known production method for polymers having a novolak resin in the main chain and an aromatic substituent in the side chain.

Specific examples of the structural unit of the naphthalene resin of formulae (1) to (5) can be shown by the following general formulae.

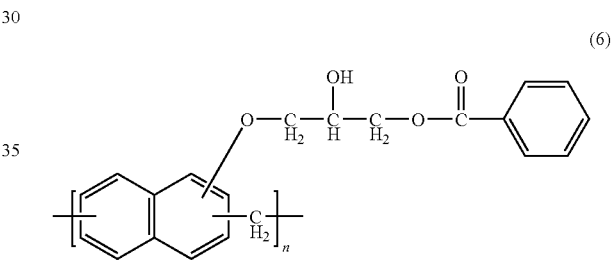

(6)

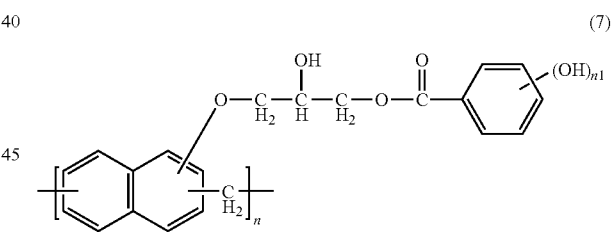

(7)

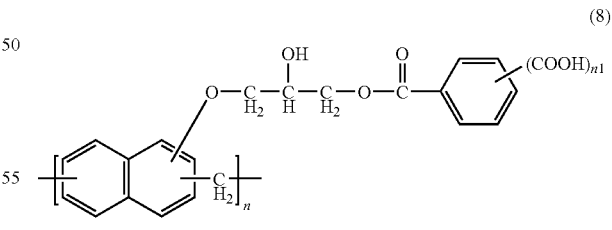

(8)

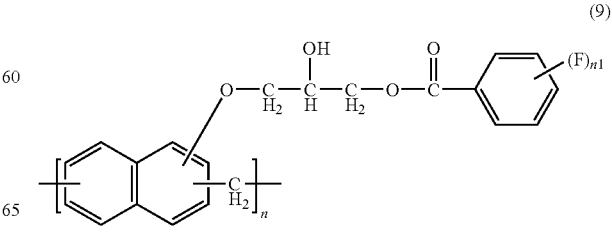

(9)

(10)
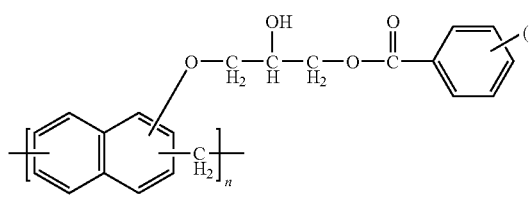
(11)
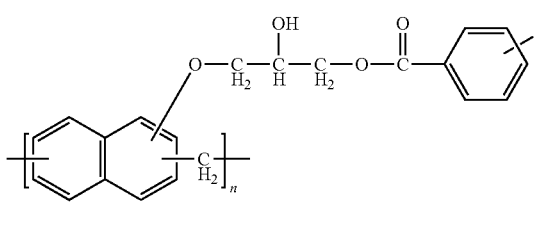
(12)
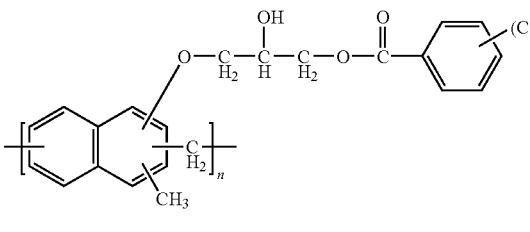
(13)
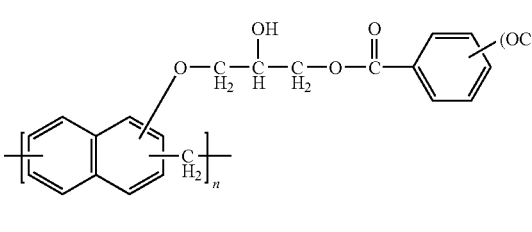
(14)
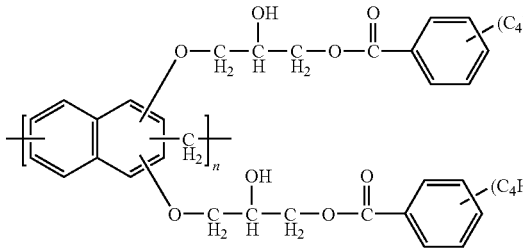
(15)
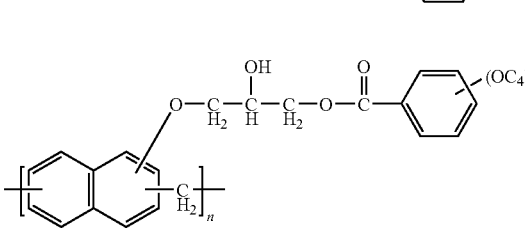
(16)
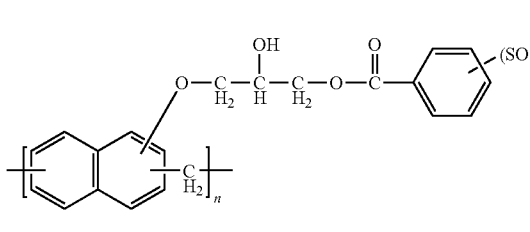
(17)
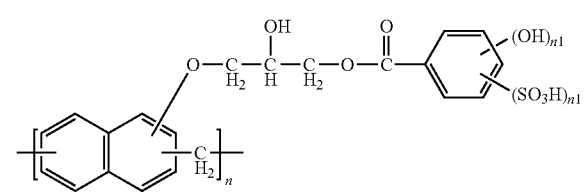
(18)
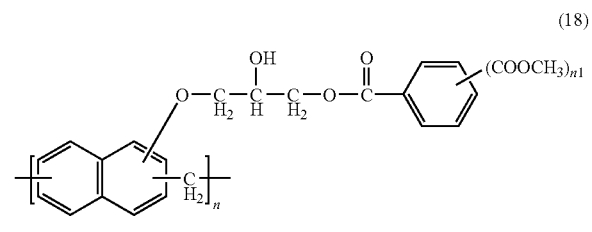
(19)
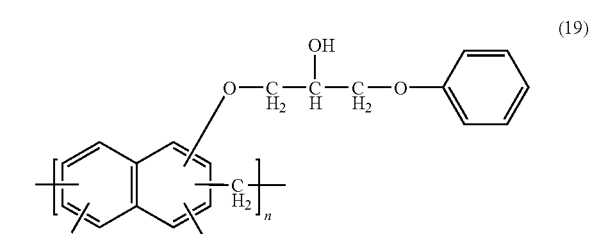
(20)
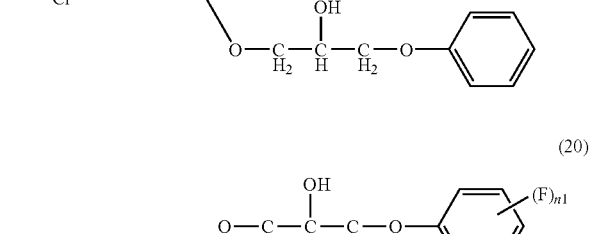
(21)
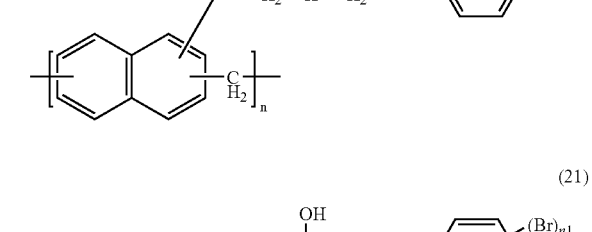
(22)
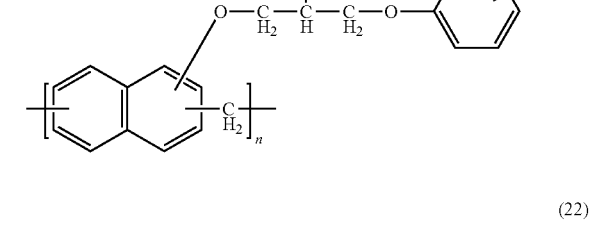

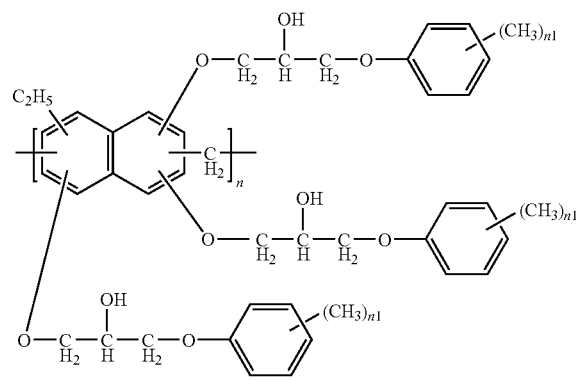
(23)
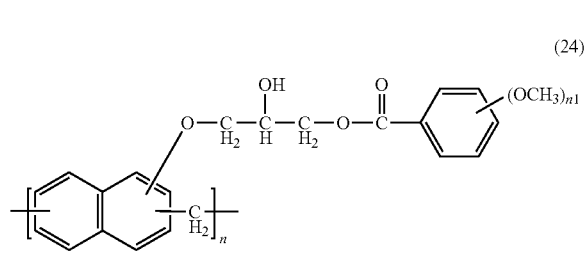
(24)
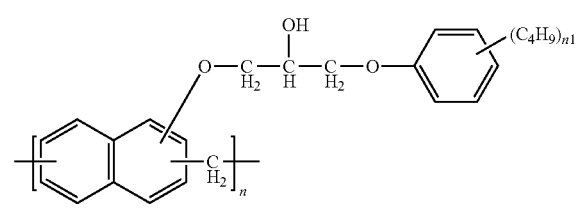
(25)
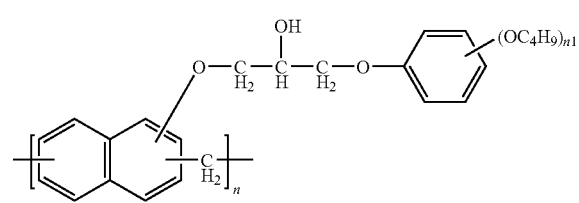
(26)
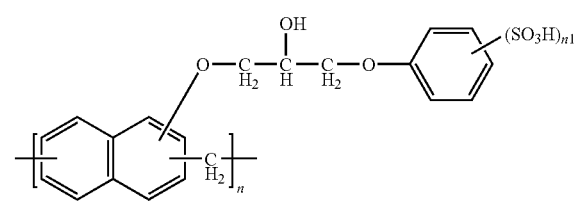
(27)
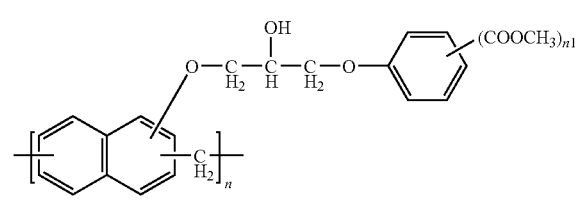
(28)
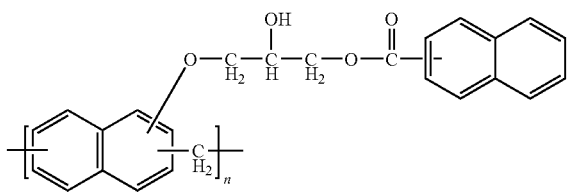
(29)
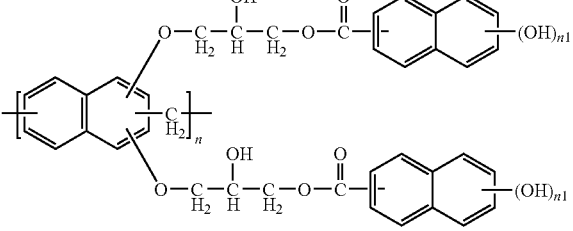
(30)
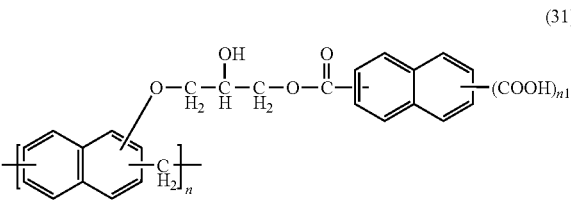
(31)
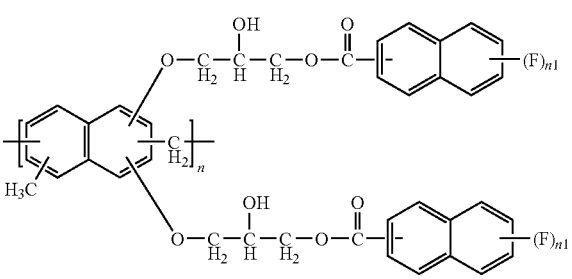
(32)
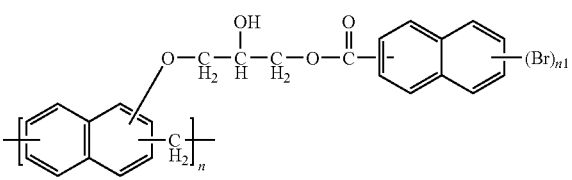
(33)
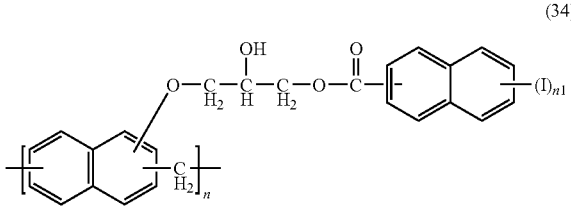
(34)

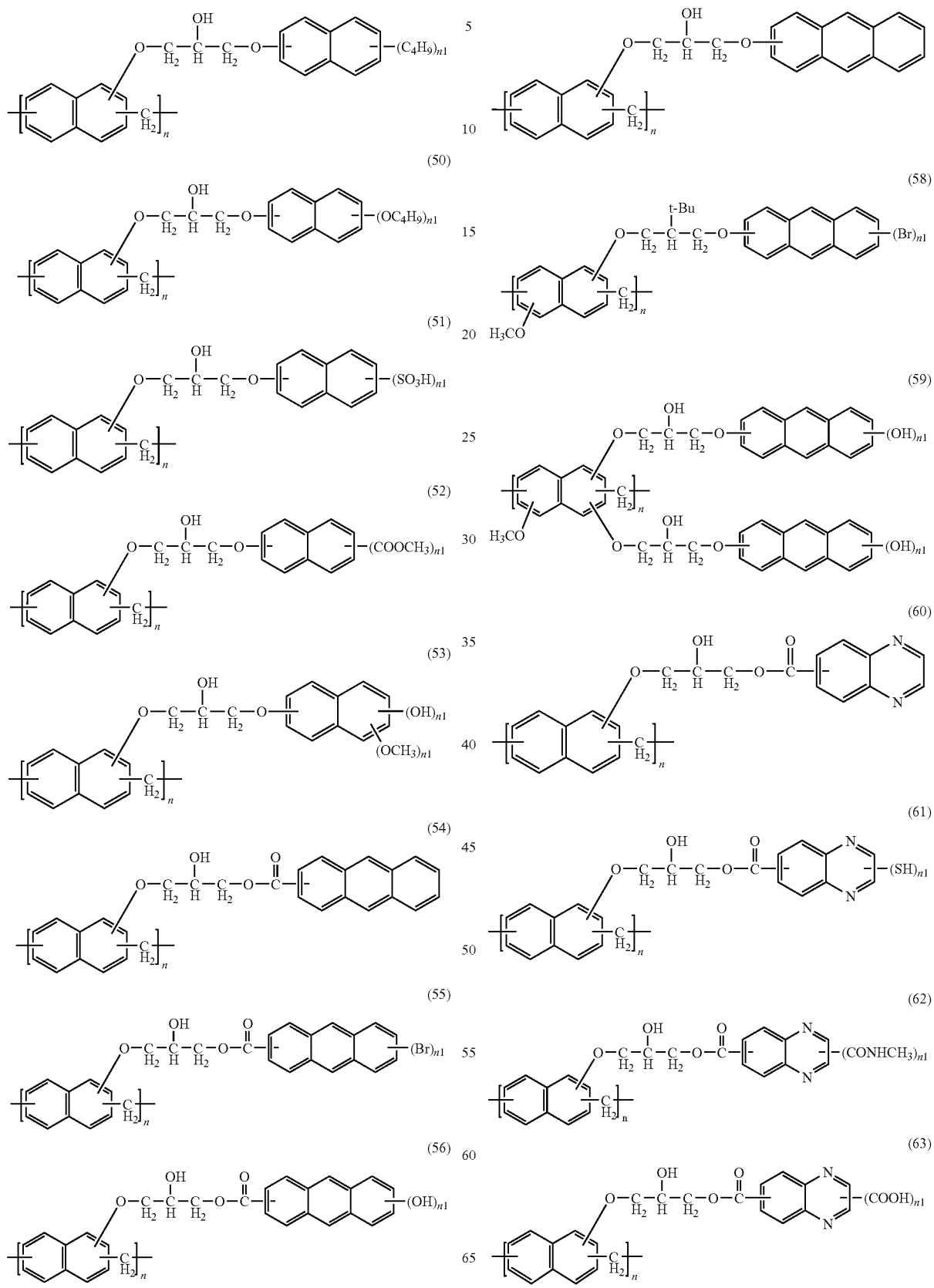

-continued
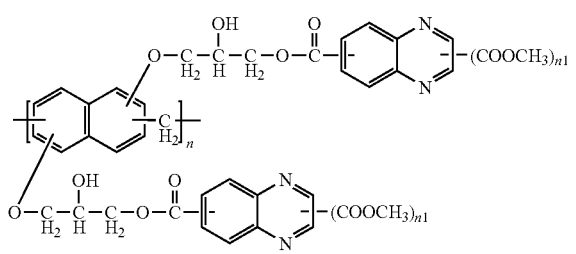
(64)
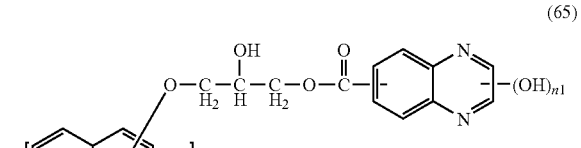
(65)
(66)
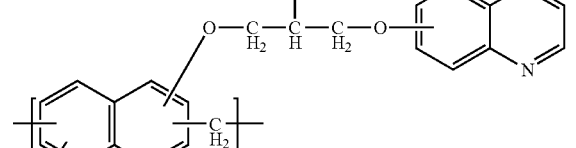
(67)
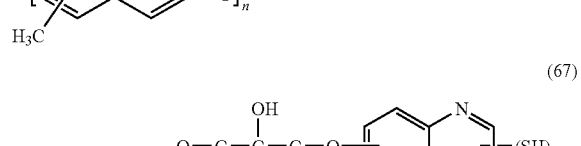
(68)
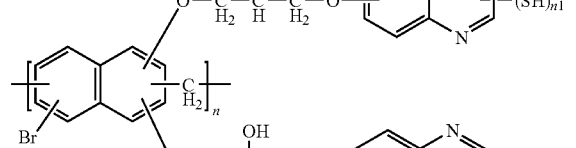
(69)
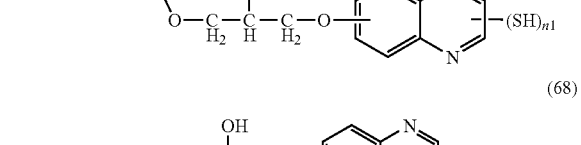
(70)
-continued
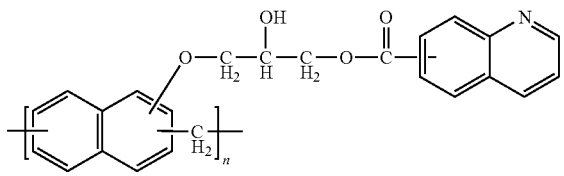
(71)
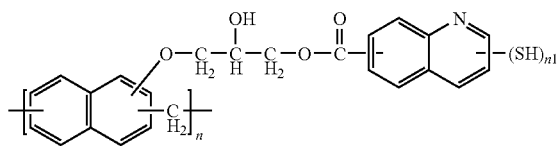
(72)
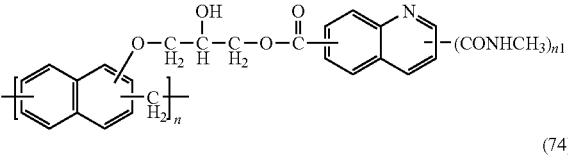
(73)
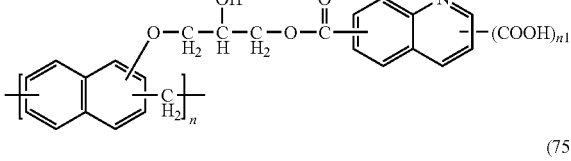
(74)
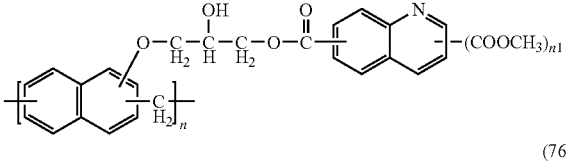
(75)
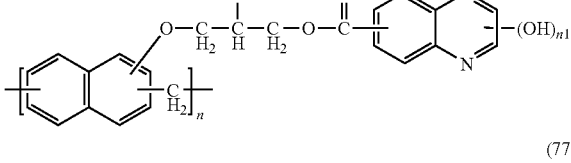
(76)
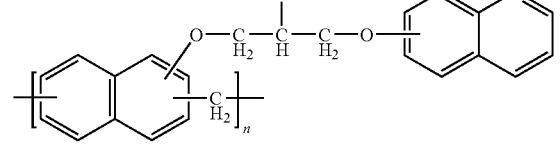
(77)
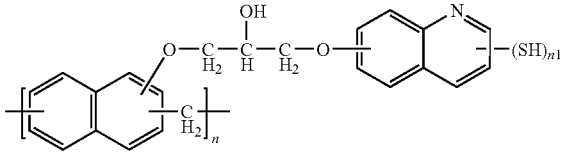
(78)
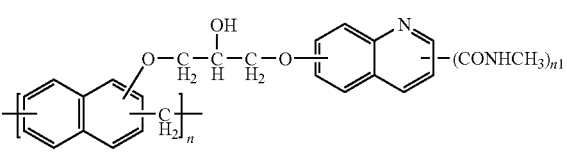
(79)

-continued

-continued
(95)
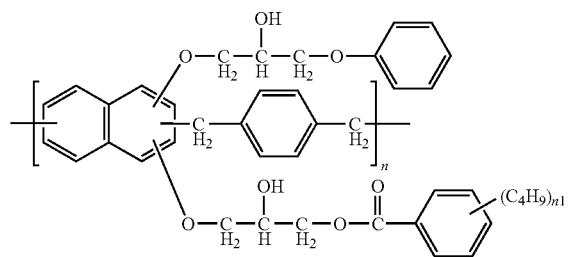
(96)
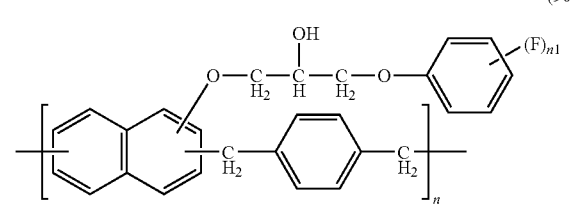
(97)
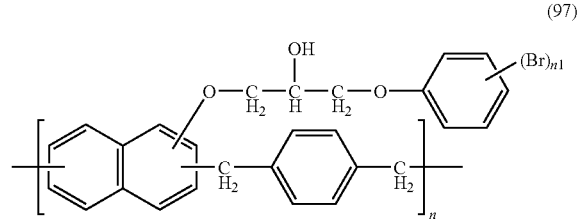
(98)
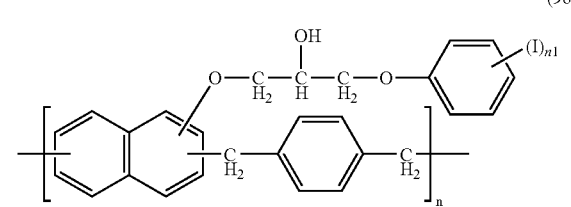
(99)
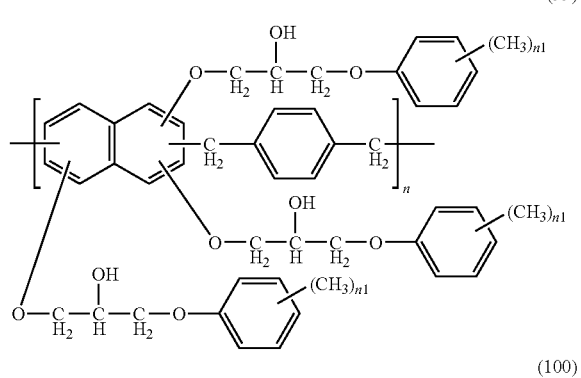
(100)
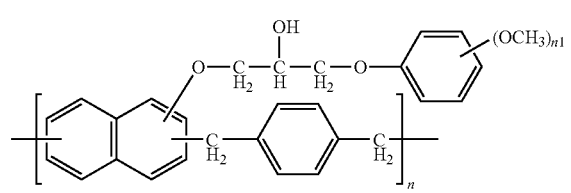
-continued
(101)
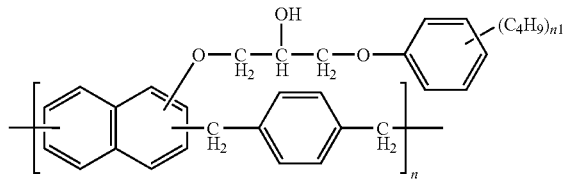
(102)
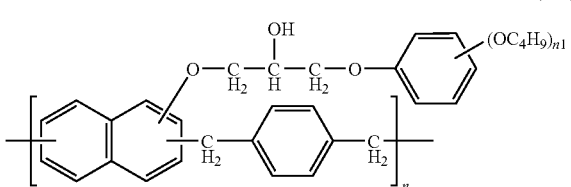
(103)
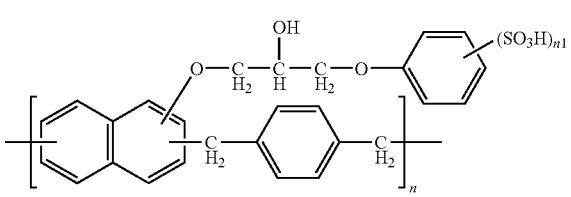
(104)
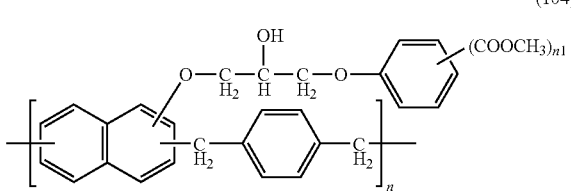
(105)
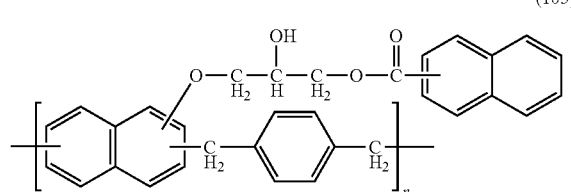
(106)
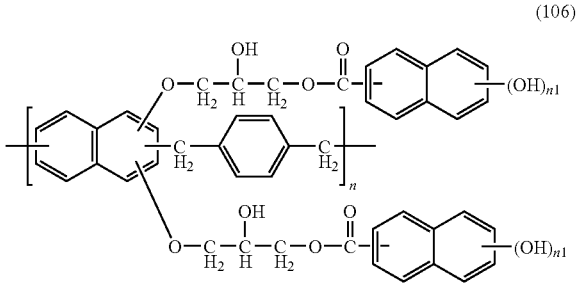
(107)
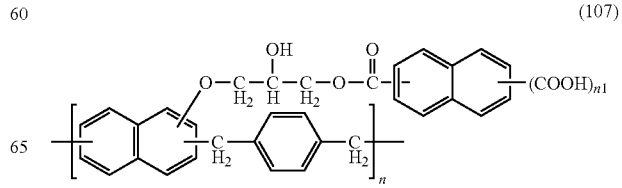

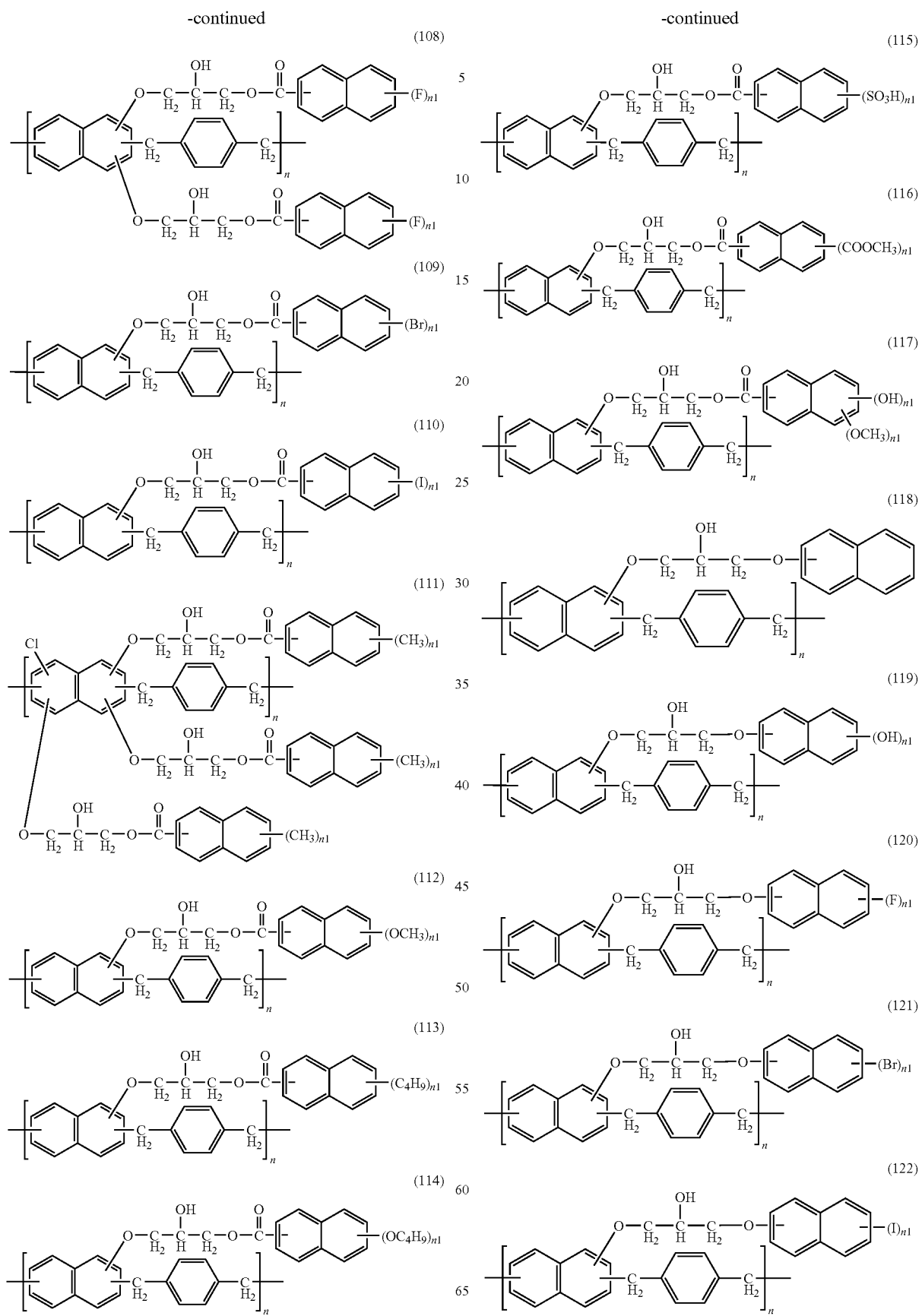

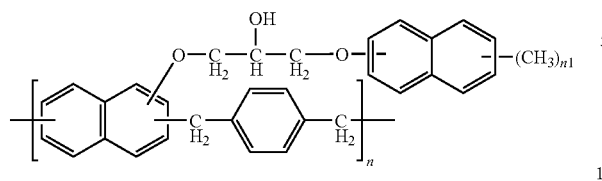
(123)
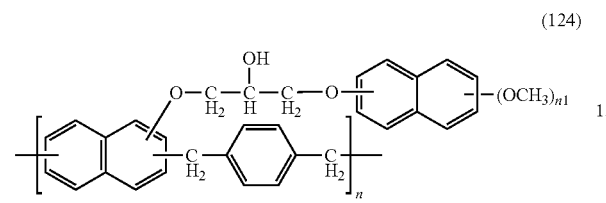
(124)
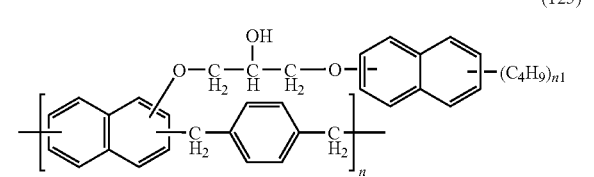
(125)
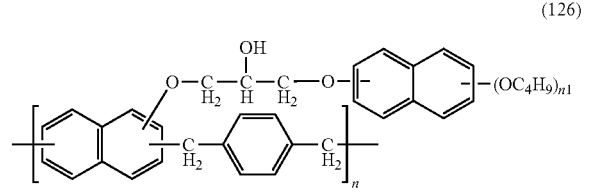
(126)
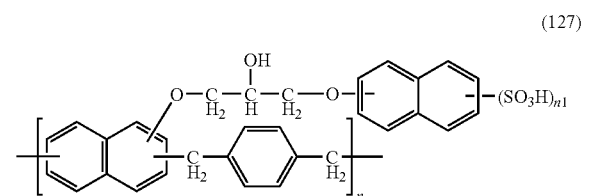
(127)
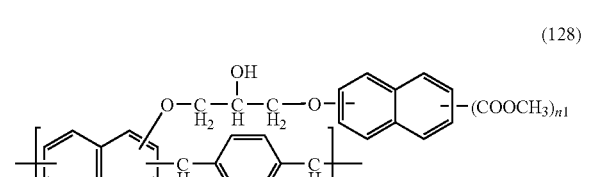
(128)
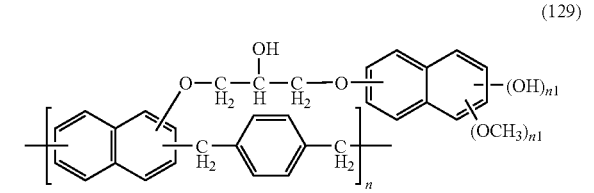
(129)
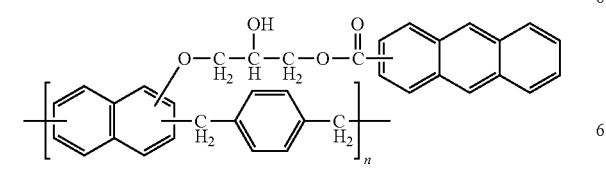
(130)
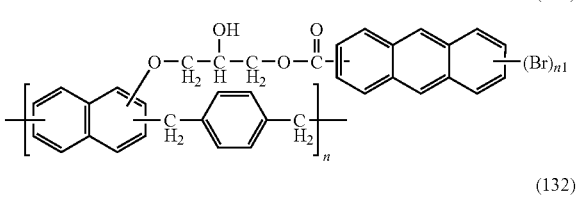
(131)
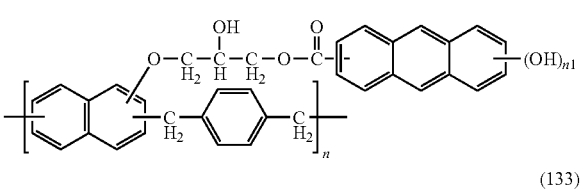
(132)
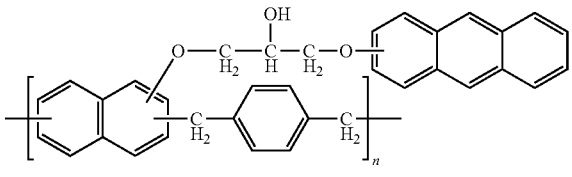
(133)
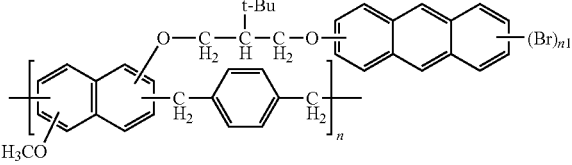
(134)
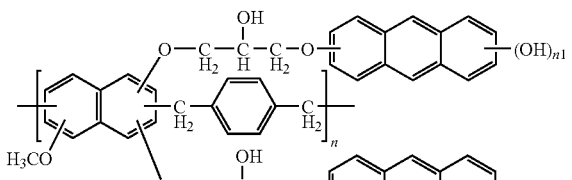
(135)
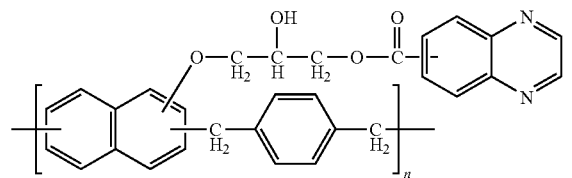
(136)
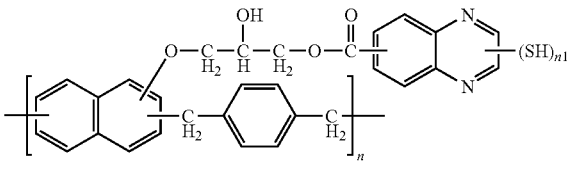
(137)
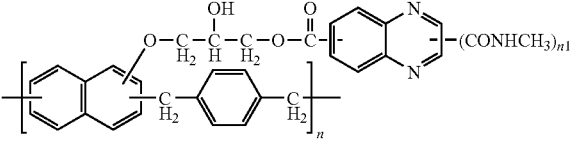
(138)

-continued
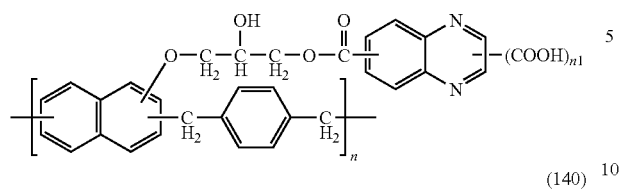 (139)
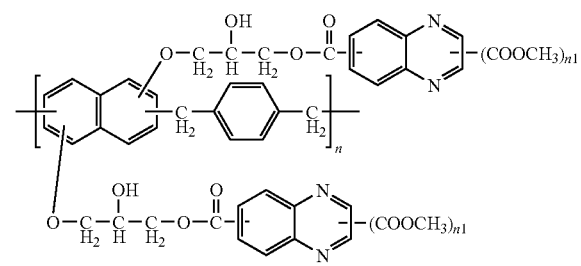 (140)
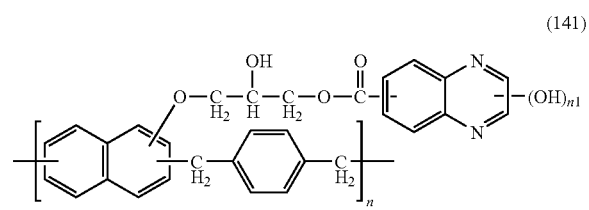 (141)
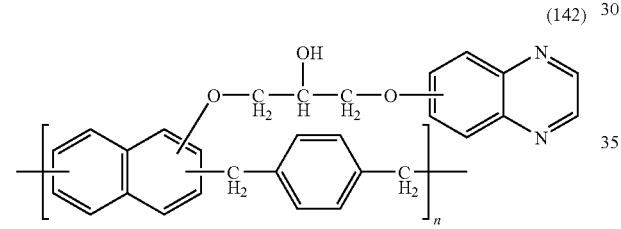 (142)
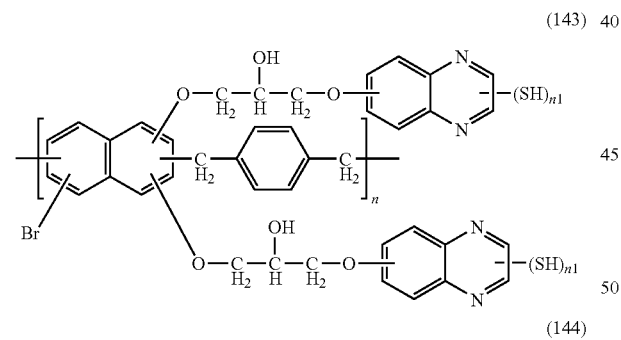 (143)
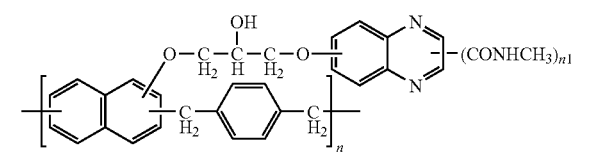 (144)
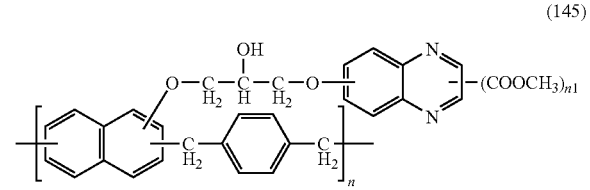 (145)
-continued
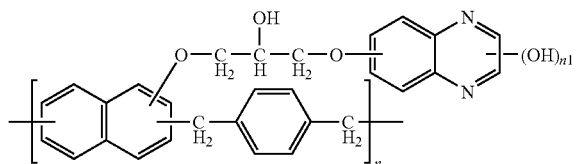 (146)
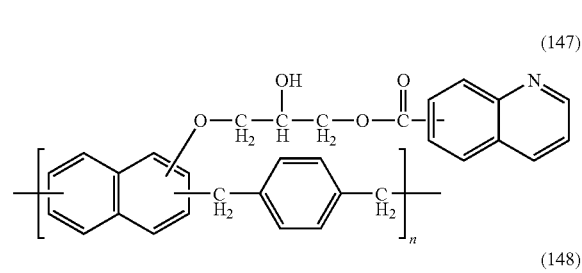 (147)
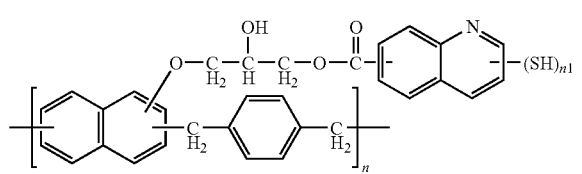 (148)
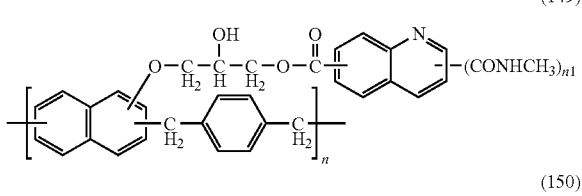 (149)
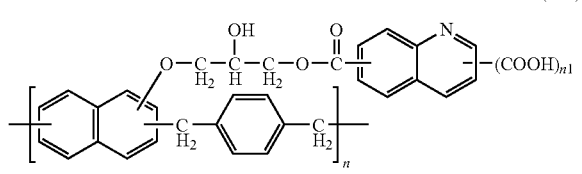 (150)
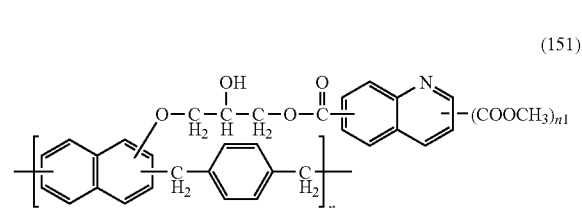 (151)
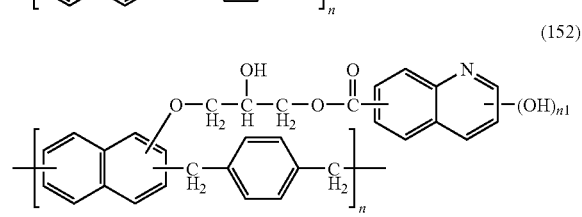 (152)
(153)

-continued

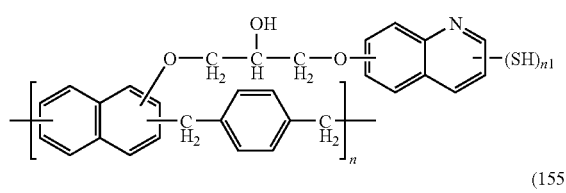
(154)

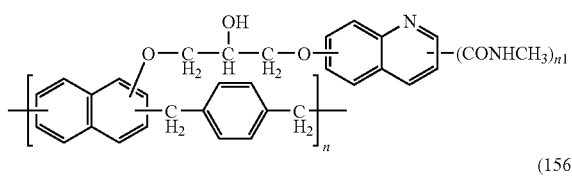
(155)

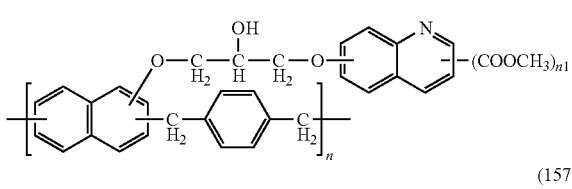
(156)

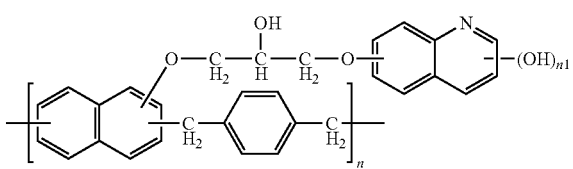
(157)

In formulae (6) to (157), number n1 is the number of substituents on the aromatic ring, and is at least 1 and at most the number of hydrogen atoms present on the aromatic ring. In addition, when some n1(s) originated from different substituents on the same aromatic ring are present, each n1 is at least 1 and the sum thereof is at most the number of hydrogen atoms present on the aromatic ring. Further, n is the number of repeating units, and has the same meaning as that of the above-mentioned formulae (1) to (5).

It is preferable to crosslink the coating-type underlayer coating forming composition for lithography of the present invention by heating after application in order to prevent any intermixing with photoresists coated thereon, and the coating-type underlayer coating forming composition for lithography of the present invention can contain further a crosslinking agent component. The crosslinking agent includes melamines, substituted ureas, or polymers thereof and the like. The crosslinking agent has preferably at least two crosslink-forming substituents, and are compounds such as methoxymethylated glycoluril, butoxymethylated glycoluril, methoxymethylated melamine, butoxymethylated melamine, methoxymethyl benzoguanamine, butoxymethylbenzoguanamine, methoxymethyl urea, butoxymethyl urea, methoxymethyl thiourea, or methoxymethyl thiourea or the like. In addition, the condensation products of these compounds can be used. The addition amount of the crosslinking agent may vary depending on the coating solvents used, the underlying substrate used, the viscosity of the solvent required, the shape of the coating required, etc., and usually 0.001 to 80% by weight, preferably 0.01 to 50% by weight, further preferably 0.05 to 40% by weight based on the whole solid content. These crosslinking agent may cause a crosslinking reaction due to self-condensation. In a case where any crosslinking substituent is present on the above-mentioned polymer compound, the crosslinking agent can cause a crosslinking reaction with these crosslinking substituents.

In the present invention, as a catalyst for accelerating the above-mentioned crosslinking reaction, an acidic compound such as p-toluene sulfonic acid, trifluoro methane sulfonic acid, pyridinium p-toluene sulfonic acid, salicylic acid, sulfosalicylic acid, citric acid, benzoic acid, hydroxybenzoic acid, naphthalene carboxylic acid or the like, or/and a thermal acid generator such as 2,4,4,6-tetrabromocyclohexadienone, benzoin tosylate, 2-nitrobenzyl tosylate, other organic sulfonic acid alkyl esters or the like can be added. The addition amount thereof is 0.0001 to 20% by weight, preferably 0.0005 to 10% by weight based on the whole solid content.

In the coating-type underlayer coating forming composition for lithography of the present invention, a photoacid generator can be added in order to conform the acidity of an underlayer coating to that of a photoresist provided on the underlayer coating in lithography process. Preferable photoacid generators are for example onium salt type photoacid generators such as bis(4-t-butylphenyl)iodonium trifluoromethane sulfonate, triphenylsulfonium trifluoromethane sulfonate or the like, halogen-containing compound type photoacid generators such as phenyl-bis(trichloromethyl) s-triazine or the like, sulfonic acid type photoacid generators such as benzoin tosylate, N-hydroxysuccinimide trifluoro methane sulfonate or the like. The photoacid generator can be added in an amount of 0.2 to 10% by weight, preferably 0.4 to 5% by weight based on the whole solid content.

In the materials for the coating-type underlayer coating of the present invention, further light absorbing agents, rheology controlling agents, adhesion auxiliaries, surfactants or the like can be added, if necessary, in addition to the above-mentioned components.

The further light absorbing agents include for example commercially available light absorbing agents described in "Technique and Market of Industrial Pigments" (CMC Publishing Co., Ltd.) or "Dye Handbook" (edited by The Society of Synthetic Organic Chemistry, Japan), for example C.I. Disperse Yellow 1, 3, 4, 5, 7, 8, 13, 23, 31, 49, 50, 51, 54, 60, 64, 66, 68, 79, 82, 88, 90, 93, 102, 114 and 124; C.I. Disperse Orange 1, 5, 13, 25, 29, 30, 31, 44, 57, 72 and 73; C.I. Disperse Red 1, 5, 7, 13, 17, 19, 43, 50, 54, 58, 65, 72, 73, 88, 117, 137, 143, 199 and 210; C.I. disperse Violet 43; C.I. Disperse Blue 96; C.I. Fluorescent Brightening Agent 112, 135 and 163; C.I. Solvent Orange 2 and 45; C.I. Solvent Red 1, 3, 8, 23, 24, 25, 27 and 49; C.I. Pigment Green 10; C.I. Pigment Brown 2, and the like can be suitably used. The light absorbing agent is generally added in an amount of 10% by weight or less, preferably 5% by weight or less based on the whole solid content of the materials for the coating-type underlayer coating material for lithography.

The rheology controlling agents are mainly added in order to increase the flowability of the coating-type underlayer coating forming composition, particularly to increase evenness in film thickness of the coating-type underlayer coating and filling property of the coating-type underlayer coating forming composition in holes. Specific examples are phthalic acid derivatives such as dimethyl phthalate, diethyl phthalate, diisobutyl phthalate, dihexyl phthalate, butyl isodecyl phthalate or the like, adipic acid derivatives such as di-n-butyl adipate, drisobutyl adipate, diisooctyl adipate, octyldecyl adipate or the like, maleic acid derivatives such as di-n-butyl maleate, diethyl maleate, dinonyl maleate or the like, oleic acid derivatives such as methyl oleate, butyl oleate, tetrahydrofurfuryl oleate or the like, stearic acid derivatives such as n-butyl stearate, glyceryl stearate, or the like. The rheology controlling agents are added in a proportion of usually less than 30% by weight based on the whole solid content of the materials for the coating-type underlayer coating.

The adhesion auxiliaries are mainly added in order to increase adhesive property between a substrate or a photoresist and a coating-type underlayer coating forming composition, particularly in order not to cause peeling of photoresists in development. Specific examples are chlorosilanes such as trimethylchlorosilane, dimethylvinylchlorosilane, methyl diphenylchlorosilane, chloromethyldimethyl chlorosilane or the like, alkoxysilanes such as trimethylmethoxysilane, dimethyldiethoxysilane, methyldimethoxysilane, dimethylvinylethoxysilane, diphenyldimethoxysilane, phenyltriethoxysilane or the like, silazanes such as hexamethyldisilazane, N,N'-bis(trimethylsilyl)urea, dimethyltrimethylsilylamine, trimethylsilylimidazole or the like, silanes such as vinyltrichlorosilane, γ-chloropropyltrimethoxysilane, γ-aminopropyltriethoxysilane, γ-glycidoxypropyltrimethoxysilane or the like, heterocyclic compounds such as benzotriazole, benzimidazole, indazole, imidazole, 2-mercaptobenzimidazole, 2-mercaptobenzothiazole, 2-mercaptobenzoxazole, urazole, thiouracyl, mercaptolmidazole, mercaptopyrimidine or the like, ureas such as 1,1-dimethylurea, 1,3-dimethylurea or the like, or thiourea compounds, etc. The adhesion auxiliaries are added in a proportion of usually less than 5% by weight, preferably 2% by weight based on the whole solid content of the materials for the coating-type underlayer coating material for lithography.

In the coating-type underlayer coating material for lithography according to the present invention, surfactants can be added in order not to cause pinholes or striation and in order to further improve coating property to surfaces with unevenness. As the surfactants, mention may be made of, for example, nonionic surfactants such as polyoxyethylene alkyl ethers, e.g., polyoxyethylene lauryl ether, polyoxyethylene stearyl ether, polyoxyethylene cetyl ether, polyoxyethylene oleyl ether, etc., polyoxyethylene alkyl allyl ethers, e.g., polyoxyethylene octyl phenol ether, polyoxyethylene nonyl phenol ether, etc.; polyoxyethylene/polyoxypropylene block copolymers, sorbitan fatty acid esters, e.g., sorbitan monolaurate, sorbitan monopalmitate, sorbitan monostearate, sorbitan monooleate, sorbitan trioleate, sorbitan tristearate, etc., polyoxyethylene sorbitan fatty acid esters, e.g., polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate, etc.; fluorine based surfactants, e.g., trade name: EFROP EF301, EF303, EF352 (manufactured by Tochem Products Co., Ltd.), trade name: MEGAFAC F171, F173 (manufactured by Dainippon Ink and Chemicals, Inc.), trade name: FLUORAD FC430, FC431 (manufactured by Sumitomo 3M Limited), trade name: ASAHI GUARD AG710, SURFLON S-382, SC101, SC102, SC103, SC104, SC105, SC106 (manufactured by Asahi Glass Co., Ltd.); organosiloxane polymer KP341 (manufactured by Shinetsu Chemical Co., Ltd.), etc. The blending amount of the surfactants is usually 0.2% by weight or less, preferably 0.1% by weight or less based on the whole solid content of the materials for the coating-type underlayer coating material of the present invention. The surfactants may be added singly or in combination of two or more.

Solvents that can be used for dissolving the above-mentioned polymer compounds and the crosslinking agent components, crosslinking catalyst and the like in the present invention, include ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monomethyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3 methoxypropionate, ethyl 3-methoxypropionate, ethyl 3-ethoxypropionate, methyl 3-ethoxypropionate, methyl pyruvate, ethyl pyruvate, ethyl acetate butyl acetate, ethyl lactate, butyl lactate or the like. These organic solvents may be used singly or in combination of two or more of them.

Further, high boiling solvents such as propylene glycol monobutyl ether or propylene glycol monobutyl ether acetate, etc. may be mixed and used. Among these solvents, from viewpoint of improvement of leveling property, the following solvents are preferable: propylene glycol monomethyl ether, propylene glycol monomethyl ether acetate, ethyl lactate, butyl lactate, and cyclohexanone, etc.

The photoresist to be coated on the coating-type underlayer coating for lithography may be a negative type or a positive type, and includes a positive type photoresist consisting of a novolak resin and 1,2-naphthoquinone diazide sulfonic acid ester, a chemically-amplified type photoresist which consists of a photoacid generator and a binder having a group which is decomposed with an acid and increases alkali dissolution rate, a chemically-amplified type photoresist consisting of an alkali-soluble binder, a photoacid generator, and a low molecular compound which is decomposed with an acid and increases the alkali dissolution rate of the photoresist, a chemically-amplified photoresist consisting of a photoacid generator, a binder having a group which is decomposed with an acid and increases the alkali dissolution rate, and a low molecular compound which is decomposed with an acid and increases the alkali dissolution rate of the photoresist, and a photoresist having Si atom in the skeleton, and for example, trade name: APEX-E manufactured by Rhom and Haas Company.

The developer that can be used for the photoresist having coating-type underlayer coating formed by using the coating-type underlayer coating material for lithography of the present invention includes aqueous solutions of alkalis, for example inorganic alkalis such as sodium hydroxide, potassium hydroxide, sodium carbonate, sodium silicate, sodium metasilicate, ammonia water or the like, primary amines such as ethyl amine, n-propyl amine or the like, secondary amines such as diethyl amine, di-n-butyl amine or the like, tertiary amines such as triethyl amine, methyldiethyl amine or the like, alcohol amines such as dimethyl ethanol amine, triethanol amine or the like, quaternary ammonium salts such as tetramethylammonium hydroxide, tetraethylammonium hydroxide, choline or the like, cyclic amine such as pyrrole, piperidine or the like, and so on. Further, alcohols such as isopropyl alcohol or the like, nonionic surfactants or the like can be added and used in these aqueous solution of alkalis. Among them, preferable developers are quaternary ammonium salts, and tetramethyl ammonium hydroxide and choline are more preferable.

Next, the method for forming photoresist pattern according to the present invention is described. On a substrate (for example, transparent substrate such as silicon/silicon dioxide coat substrate, glass substrate, ITO substrate or the like) that is used for the manufacture of precision integrated circuit elements, the coating-type underlayer coating forming composition is coated by a suitable coating method, for example, with a spinner, a coater or the like, and thereafter the substrate is baked to fabricate a coating-type underlayer coating. The film thickness of the coating-type underlayer coating is preferably 0.01 to 3.0 µm. The baking after coating is performed under a condition of a temperature of 80 to 250° C. and a time of 1 to 120 minutes Good photoresist pattern can be obtained by applying a photoresist directly on the coating-type underlayer coating or on one to some layers of coatings formed on the coating-type underlayer coating if necessary, exposing to light through a predetermined mask, developing, rinsing and drying. If necessary, post exposure bake (PEB) can be also performed. Then, the part of the coating-type underlayer coating that corresponds to the part of the photoresist removed by the above-mentioned development step can be removed by dry etching to form a desired pattern on the substrate.

That is, semiconductor devices can be produced through the following steps: a step of forming a coating-type underlayer coating from the coating-type underlayer coating forming composition on a semiconductor substrate, a step of forming a resist coating thereon, a step of forming a resist pattern by exposure to light and development, a step of etching the coating-type underlayer coating by the resist pattern, and a step of processing the semiconductor substrate by the patterned coating-type underlayer coating.

When miniaturization of resist pattern progresses in future, problems such as a low resolution and collapse of resist pattern after development occur, and thus it is desired to make photoresists thinner. Therefore, it is difficult to obtain a film thickness of resist pattern sufficient for the processing of substrates, and processes for providing a function as a mask in the substrate processing not only for resist pattern but also for coating-type underlayer coating formed between a resist and a semiconductor substrate to be processed become required. As the coating-type underlayer coating for such a process, a coating-type underlayer coating for lithography having a selection ratio of dry etching rate close to that of photoresists, a coating-type underlayer coating for lithography having a lower selection ratio of dry etching rate than that of photoresists, or a coating-type underlayer coating for lithography having a lower selection ratio of dry etching rate than that of semiconductor substrates, which is different from conventional high etch rate coating-type underlayer coatings, becomes required. It is also able to confer anti-reflective performance to the coating-type underlayer coatings, and they can have the function of the conventional anti-reflective coatings together.

On the other hand, for obtaining fine resist pattern, it begins to use a process in which the resist pattern and the coating-type underlayer coating are made thinner on dry etching of coating-type underlayer than the width of pattern on the development of photoresists. As the coating-type underlayer coating for such a process, a coating-type underlayer coating for lithography having a selection ratio of dry etching rate close to that of photoresists which is different from conventional high etch rate coating-type underlayer coatings, becomes required. It is also able to confer anti-reflective performance to the coating-type underlayer coatings, and they can have the function of the conventional anti-reflective coatings together.

In the present invention, a photoresist can be coated directly on a coating-type underlayer coating formed by the coating-type underlayer coating forming composition of the present invention, or on one to some layers of coatings formed on the coating-type underlayer coating if necessary. Therefore, even when a thin photoresist is coated in order to prevent collapse of pattern due to narrow width of photoresist pattern, it make possible to perform the processing of substrates by selecting a suitable etching gas.

That is, semiconductor devices can be produced through the following steps; a step of forming a coating-type underlayer coating from the coating-type underlayer coating forming composition on a semiconductor substrate, a step of forming a hardmask from a coating material containing silicon component or the like thereon, a step of forming a resist coating further thereon, a step of forming a resist pattern by exposure to light and development, a step of etching the hardmask by the resist pattern, a step of etching the coating-type underlayer coating by the patterned hardmask, and a step of processing the semiconductor substrate by the patterned coating-type underlayer coating.

The coating-type underlayer coating for lithography containing a naphthalene resin according to the present invention has characteristics that can provide dry etching rate suitable for satisfying these requirements.

Taking into account the effect of the coating-type underlayer coating forming composition for lithography of the present invention as an anti-reflective coating, it does not diffuse into photoresists on drying with heat as the light absorbing moiety is incorporated in the skeleton, and an antireflection effect is high as the light absorbing moiety has a high light absorption property.

The coating-type underlayer coating forming composition for lithography of the present invention has a thermal stability, and can prevent contamination on the upper layer coating due to decomposed products on baking and provide a wide temperature margin in baking step.

Further, depending on the processing condition, the coating-type underlayer coating material for lithography of the present invention can be used as a coating having a function of preventing light reflection and a function of preventing an interaction between a substrate and a photoresist, or an adverse effect to the substrate by the material used for the photoresist or substances generated on exposure to the photoresist.

Hereinafter, the present invention will be further described based on examples and comparative examples but the present invention is not limited thereto.

EXAMPLES

Synthetic Example 1

After 50.0 g of the compound of formula (158) (manufactured by Daicel Chemical Industries, Ltd., trade name: EHPE3150) and 57.4 g of 9-anthracene carboxylic acid were dissolved in 435.7 g of propylene glycol monomethyl ether, 1.5 g of benzyl triethyl ammonium was added, and the resulting mixture was refluxed for 24 hours to obtain a solution of the polymer compound of formula (159). GPC analysis of the resulting polymer compound showed that it had a weight average molecular weight of 3000 in terms of standard polystyrene.

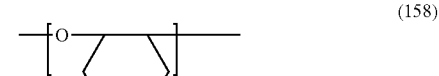

(158)

(159)

Synthetic Example 2

After 50.0 g of the compound of formula (160) (manufactured by Nippon Steel Chemical Co., Ltd., trade name: ESN175S) and 37.3 g of 9-anthracene carboxylic acid were dissolved in 353.0 g of propylene glycol monomethyl ether, 1.0 g of benzyl triethyl ammonium was added, and the resulting mixture was refluxed for 24 hours to obtain a solution of the polymer compound of formula (161). GPC analysis of the resulting polymer compound showed that it had a weight average molecular weight of 2500 in terms of standard polystyrene.

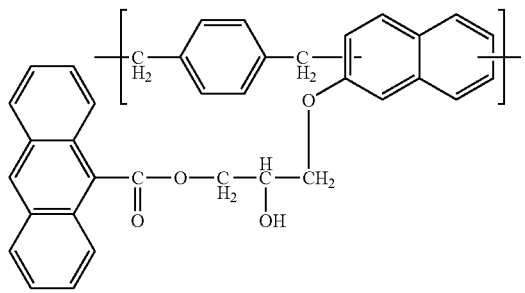

(161)

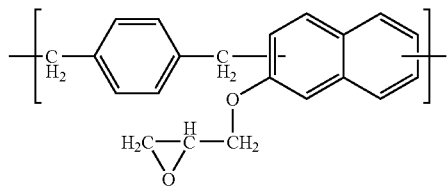

(160)

Synthetic Example 3

After 50.0 g of the compound of formula (162) (manufactured by Nippon Steel Chemical Co., Ltd., trade name: ESN375) and 60.1 g of 9-anthracene carboxylic acid were dissolved in 447.0 g of propylene glycol monomethyl ether, 1.6 g of benzyl triethyl ammonium was added, and the resulting mixture was refluxed for 24 hours to obtain a solution of the polymer compound of formula (163). GPC analysis of the resulting polymer compound showed that it had a weight average molecular weight of 2500 in terms of standard polystyrene.

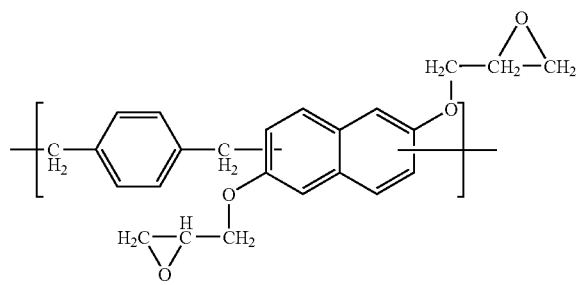

(162)

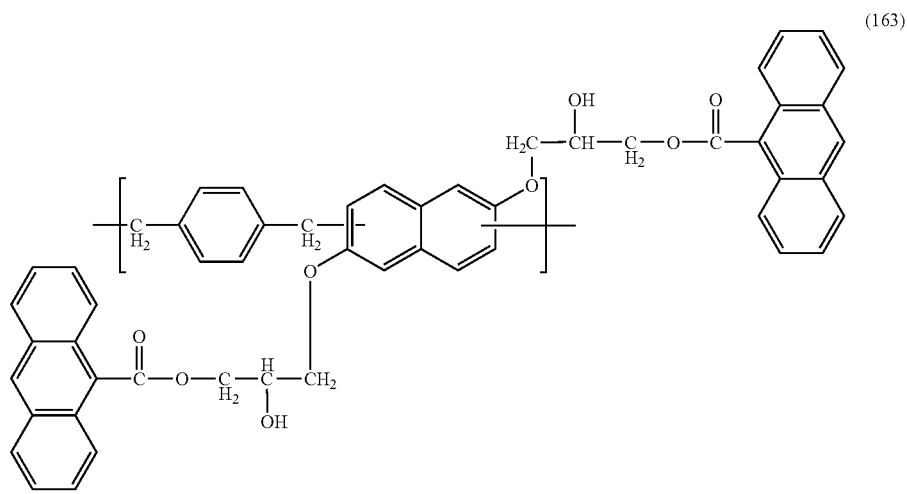

(163)

Synthetic Example 4

After 21 g of glycidyl methacrylate and 39 g of 2-hydroxypropyl methacrylate were dissolved in 242 g of propylene glycol monomethyl ether, the temperature was raised to 70° C. Then, while maintaining the reaction solution at 70° C., 0-6 g of azobisisobutyronitrile was added and the solution was subjected to a reaction at 70° C. for 24 hours to obtain a solution of the polymer compound of formula (164). GPC analysis of the resulting polymer compound showed that it had a weight average molecular weight of 50000 in terms of standard polystyrene.

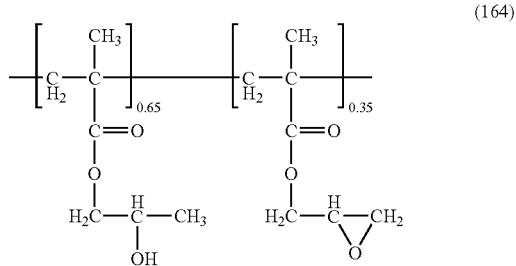

(164)

In 100 g of a solution containing 20 g of the above-mentioned resin, 10 g of 9 anthracene carboxylic acid and 0.3 g of benzyltriethyl ammonium chloride were added, and reacted at 130° C. for 24 hours to obtain a solution of the polymer compound of formula (165).

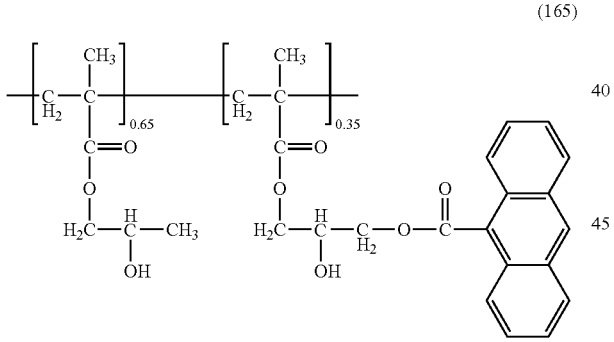

(165)

Synthetic Example 5

After 13.2 g of hydroxypropyl methacrylate and 6.8 g of benzyl methacrylate were dissolved in 74.4 g of tetrahydrofuran, the temperature was raised to 70° C. Then, while maintaining the reaction solution at 70° C. 0.2 g of azobisisobutyronitrile was added and the solution was subjected to a reaction at 70° C. for 24 hours. After the reaction solution was cooled, it was put in diethyl ether to make the polymer re-precipitated. The resulting polymer was dried with heat to obtain the resin of formula (166) GPC analysis of the resulting polymer compound showed that it had a weight average molecular weight of 70000 in terms of standard polystyrene.

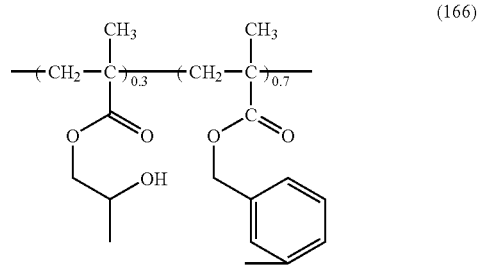

(166)

Example 1

In 10 g of a solution containing 2 g of the polymer compound obtained in Synthesis Example 2 in propylene glycol monomethyl ether, 0.4 g of tetrabutoxymethyl glycol uril and 0.05 g of pyridinium p-toluene sulfonic acid were mixed, and dissolved in 3.0 g of propylene glycol monomethyl ether and 11.0 g of ethyl lactate to obtain a solution. Thereafter, the solution was filtered through a micro filter made of polyethylene having a pore diameter of 0.10 µm and then through a micro filter made of polyethylene having a pore diameter of 0.05 µm to prepare a solution for coating-type underlayer coating for lithography.

Example 2

In 10 g of a solution containing 2 g of the polymer compound obtained in Synthesis Example 3 in propylene glycol monomethyl ether, 0.4 g of tetrabutoxymethyl glycol uril and 0.05 g of pyridinium p-toluene sulfonic acid were mixed, and dissolved in 3.0 g of propylene glycol monomethyl ether and 11.0 g of ethyl lactate to obtain a solution. Thereafter, the solution was filtered through a micro filter made of polyethylene having a pore diameter of 0.10 µm and then through a micro filter made of polyethylene having a pore diameter of 0.05 µm to prepare a solution for coating-type underlayer coating for lithography.

Example 3

In 5 g of a solution containing 1 g of the polymer compound obtained in Synthesis Example 1 in propylene glycol monomethyl ether and 5 g of a solution containing 1 g of the polymer compound obtained in Synthesis Example 2, 0.4 g of tetrabutoxymethyl glycol uril and 0.05 g of pyridinium p-toluene sulfonic acid were mixed, and dissolved in 3.0 g of propylene glycol monomethyl ether and 11.0 g of ethyl lactate to obtain a solution. Thereafter, the solution was filtered through a micro filter made of polyethylene having a pore diameter of 0.10 µm and then through a micro filter made of polyethylene having a pore diameter of 0.05 µm to prepare a solution for coating-type underlayer coating for lithography.

Example 4

In 8 g of a solution containing 1.6 g of the polymer compound obtained in Synthesis Example 1 in propylene glycol monomethyl ether and 2 g of a solution containing 0.4 g of the polymer compound obtained in Synthesis Example 2, 0.4 g of tetrabutoxymethyl glycol uril and 0.05 g of pyridinium p-toluene sulfonic acid were mixed, and dissolved in 3.0 g of propylene glycol monomethyl ether and 11.0 g of ethyl lactate to obtain a solution. Thereafter, the solution was filtered through a micro filter made of polyethylene having a pore diameter of 0.10 µm and then through a micro filter made of polyethylene having a pore diameter of 0.05 µm to prepare a solution for coating-type underlayer coating for lithography.

Comparative Example 1

In 10 g of a solution containing 2 g of the polymer compound obtained in Synthesis Example 4 in propylene glycol monomethyl ether, 0.5 g of tetramethoxymethyl glycol uril and 0.02 g of p-toluene sulfonic acid were mixed, and dissolved in 37.3 g of propylene glycol monomethyl ether and 19.4 g of propylene glycol monomethyl ether acetate to obtain a solution. Thereafter, the solution was filtered through a micro filter made of polyethylene having a pore diameter of 0.10 µm and then through a micro filter made of polyethylene having a pore diameter of 0.05 µm to prepare a solution for anti-reflective coating.

Comparative Example 2

In 10 g of a solution containing 2 g of the polymer compound obtained in Synthesis Example 5 in tetrahydrofuran, 0.5 g of hexamethylol melamine and 0.05 g of p-toluene sulfonic acid were mixed, and dissolved in 39.5 g of propylene glycol monomethyl ether to obtain a solution. Thereafter, the solution was filtered through a micro filter made of polyethylene having a pore diameter of 0.10 µm and then through a micro filter made of polyethylene having a pore diameter of 0.05 µm to prepare a solution for anti-reflective coating.

Measurement of Optical Parameter

The solutions for coating-type underlayer coating prepared in Examples 1 to 4 or the solutions for anti-reflective coating prepared in Comparative Examples 1 and 2 were coated on silicon wafers by means of a spinner. The coated silicon wafers were baked at 205° C. for 1 minute on a hot plate to form coating-type underlayer coatings or anti-reflective coatings (film thickness 0.06 µm). On the coating-type underlayer coatings or antireflective coatings, refractive index (n) and attenuation coefficient (k) at a wavelength of 248 nm or 193 nm were measured with a spectroscopic ellipsometer. The results are shown in Table 1.

Dissolution Test in Photoresist Solvent

The solutions for coating-type underlayer coating prepared in Examples 1 to 4 or the solutions for anti-reflective coating prepared in Comparative Examples 1 and 2 were coated on silicon wafers by means of a spinner. The coated silicon wafers were baked at 205° C. for 1 minute on a hot plate to form coating-type underlayer coatings or anti-reflective coatings (film thickness 0.10 µm). The coating-type underlayer coatings or anti-reflective coatings were dipped in a solvent used for photoresists, for example ethyl lactate, and propylene glycol monomethyl ether and as a result it was confirmed that the resulting coating-type underlayer coatings or anti-reflective coatings were insoluble in these solvents.

Test of Intermixing with Photoresist

The solutions for coating-type underlayer coating prepared in Examples 1 to 4 or the solutions for anti-reflective coating prepared in Comparative Examples 1 and 2 were coated on silicon wafers by means of a spinner. The coated silicon wafers were baked at 205° C. for 1 minute on a hot plate to form coating-type underlayer coatings or antireflective coatings (film thickness 0.10 µm). On each of the coating-type underlayer coatings or anti-reflective coatings was coated a commercially available photoresist solution (trade name: UV113 manufactured by Shipley Corporation) by means of a spinner. The coated wafers were heated at 120° C. for 1 minute on a hot plate. After exposure of the photoresists to light, post exposure bake was performed at 115° C. for 1 minute. After developing the photoresists, the film thickness of the coating-type underlayer coatings or anti-reflective coatings was measured and it was confirmed that no intermixing occurred between the coating-type underlayer coatings obtained from the solutions for coating-type underlayer coating prepared in Examples 1 to 4 or the anti-reflective coatings obtained from the solutions for anti-reflective coating prepared in Comparative Examples 1 and 2 and the photoresist layers.

Measurement of Dry Etching Rate

The solutions for coating-type underlayer coating prepared in Examples 1 to 4 or the solutions for anti-reflective coating prepared in Comparative Examples 1 and 2 were coated on a silicon wafer by means of a spinner. The coated silicon wafers were baked at 205° C. for 1 minute on a hot plate to form coating-type underlayer coatings or anti-reflective coatings (film thickness 0.10 µm). Then, dry etching rate on these underlayer coatings or anti-reflective coatings was measured with RIE system ES401 manufactured by Nippon Scientific Co., Ltd., RIE-10NR manufactured by SAMCO Inc., or TCP9400 manufactured by Lam Research Co., Ltd.

In addition, similarly to the above, a coating was formed on a silicon wafer with a photoresist solution (trade name: UV113 manufactured by Shipley Corporation) by means of a spinner. Then, dry etching rate was measured with RIE system ES401 manufactured by Nippon Scientific Co., Ltd., and compared with the dry etching rate of the coating-type underlayer coatings or anti-reflective coatings of Examples 1 to 4 or Comparative Examples 1 and 2. The results are shown in Table 1.

Further, dry etching rate of the semiconductor substrate was measured with RIE-10NR manufactured by SAMCO Inc., or TCP9400 manufactured by Lam Research Co., Ltd., and compared with the dry etching rate of the coating-type underlayer coatings or anti-reflective coatings of Examples 1 to 4 or Comparative Examples 1 and 2. The results are shown in Table 2.

In Table 2, Measurement (1) of dry etching rate ratio of the coating-type underlayer coating of the present invention to the resist (coating-type underlayer coating/resist) was performed by using $CF_4$ gas as dry etching gas.

Measurement (2) of dry etching rate ratio of $SiO_2$ coating on the substrate to the coating-type underlayer coating of the present invention ($SiO_2$/coating-type underlayer coating) was performed by using $C_4F_8$ gas as dry etching gas.

Measurement (3) of dry etching rate ratio of silicon nitride coating on the substrate to the coating-type underlayer coating of the present invention (silicon nitride/coating-type underlayer coating) was performed by using $CHF_3$ gas as dry etching gas.

Measurement (4) of dry etching rate ratio of polysilicon coating on the substrate to the coating-type underlayer coating of the present invention (polysilicon/coating-type underlayer coating) was performed by using $Cl_2$ gas as dry etching gas.

TABLE 1

Refractive Index (n) and Optical Absorption Coefficient (k)

| | Refractive Index (n) (wavelength 248 nm) | Optical Absorption Coefficient (k) (wavelength 248 nm) |
|---|---|---|
| Example 1 | 1.80 | 070 |
| Example 2 | 1.62 | 0.87 |
| Example 3 | 1.60 | 0.64 |
| Example 4 | 1.48 | 0.68 |
| Comparative Example 1 | 1.47 | 0.47 |
| Comparative Example 2 | | |

| | Refractive Index (n) (wavelength 193 nm) | Optical Absorption Coefficient (k) (wavelength 193 nm) |
|---|---|---|
| Example 1 | 1.49 | 0.41 |
| Example 2 | 1.54 | 0.32 |
| Example 3 | 1.60 | 0.28 |
| Example 4 | 1.61 | 0.21 |
| Comparative Example 1 | | |
| Comparative Example 2 | 1.82 | 0.34 |

TABLE 2

Dry Etching Rate Ratio

| | (1) | (2) | (3) | (4) |
|---|---|---|---|---|
| Example 1 | 0.9 | 6.2 | 5.1 | 3.7 |
| Example 2 | 0.9 | 6.2 | 5.0 | 3.7 |
| Example 3 | 1.0 | 7.0 | 4.5 | 3.1 |
| Example 4 | 1.1 | 5.0 | 3.9 | 2.5 |
| Comparative Example 1 | 1.3 | 3.7 | 2.8 | 2.0 |
| Comparative Example 2 | 1.4 | 3.4 | 2.5 | 1.8 |

It is found from these results that the coating-type underlayer coating material for lithography of the present invention can provide an excellent coating-type underlayer coating having a selection ratio of dry etching rate close to that of photoresists, or a lower selection ratio of dry etching rate than that of photoresists, or a lower selection ratio of dry etching rate than that of semiconductor substrates which is different from conventional high etch rate anti-reflective coatings, and further having an effect as an anti-reflective coating,

INDUSTRIAL APPLICABILITY

The purpose of the present invention is provide a coating-type underlayer coating for lithography having a selection ratio of dry etching rate close to that of photoresists, a coating-type underlayer coating for lithography having a lower selection ratio of dry etching rate than that of photoresists, or a coating-type underlayer coating for lithography having a lower selection ratio of dry etching rate than that of semiconductor substrates, that causes no intermixing with photoresist layers and provides excellent photoresist pattern. In addition, the coating-type underlayer coating material of the present invention can confer a property for absorbing effectively reflection light from substrates in a case where irradiation light having a wavelength of 248 nm, 193 nm, 157 nm or the like is used in the micro-processing.

The coating-type underlayer coating forming composition of the present invention can form easily an underlayer coating through a coating system for example by coating the underlayer coating forming composition with a spinner, and heating. The composition of the present invention can applied by use of these characteristics to a process in which multi-layer coating for the manufacture of semiconductor devices that require micro-processing with small line width.

The invention claimed is:

1. A coating-type underlayer coating forming composition for lithography comprising a compound of formula (1):

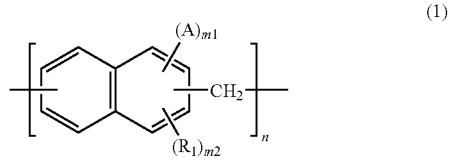

wherein A is an organic group having an aromatic group, $R_1$ is hydroxy group, an alkyl group, an alkoxy group, a halogen group, a thiol group, an amino group or an amide group, m1 is the number of A substituted on the naphthalene ring and is an integer of 1 to 6, m2 is the number of $R_1$ substituted on the naphthalene ring and is an integer of 0 to 5, a sum of m1 and m2 (m1+m2) is an integer of 1 to 6, in cases where the sum is an integer other than 6, the remainder is hydrogen atom, and n is the number of repeating units ranging from 2 to 7000.

2. The coating-type underlayer coating forming composition for lithography according to claim 1, further comprising a crosslinking compound.

3. The coating-type underlayer coating forming composition for lithography according to claim 2, further comprising an acid, an acid generator, or both of them.

4. The coating-type underlayer coating forming composition for lithography according to claim 1, further comprising an acid, an acid generator, or both of them.

5. A coating type underlayer coating for lithography obtained by coating the coating-type underlayer coating forming composition according to claim 1 on a semiconductor substrate and baking it.

6. A method for forming photoresist pattern for use in manufacture of semiconductor device, comprising coating the coating-type underlayer coating forming composition according to claim 1 on a semiconductor substrate, and baking it to form a coating-type underlayer coating.

7. A method for manufacturing semiconductor device comprising the steps of:
forming a coating-type underlayer coating from the coating-type underlayer coating forming composition according to claim 1;
forming a resist coating on the coating-type underlayer coating;
forming a resist pattern by exposure to light and development;
etching the coating-type underlayer coating by use of the resist pattern; and
processing the semiconductor substrate by use of the patterned coating-type underlayer coating.

8. A method for manufacturing semiconductor device comprising the steps of:
forming a coating-type underlayer coating from the coating type underlayer coating forming composition according to claim 1;
forming a hardmask on the coating-type underlayer coating;
forming a resist coating further thereon;

forming a resist pattern by exposure to light and development;

etching the hardmask by use of the resist pattern;

etching the coating-type underlayer coating by use of the patterned hardmask; and processing the semiconductor substrate by use of the patterned coating-type underlayer coating.

9. A coating-type underlayer coating forming composition for lithography comprising a compound of formula (2):

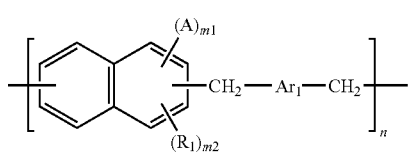
(2)

wherein A is an organic group having an aromatic group, $R_1$ is a hydroxy group, an alkyl group, an alkoxy group, a halogen group, a thiol group, an amino group or an amide group, m1 is the number of A substituted on the naphthalene ring and is an integer of 1 to 6, m2 is the number of $R_1$ substituted on the naphthalene ring and is an integer of 0 to 5, a sum of m1 and m2 (m1+m2) is an integer of 1 to 6, in cases where the sum is an integer other than 6, the remainder is hydrogen atom, n is the number of repeating units ranging from 2 to 7000, and $Ar_1$ is a substituted or unsubstituted aromatic group.

10. A coating-type underlayer coating forming composition for lithography comprising a compound of formula (3):

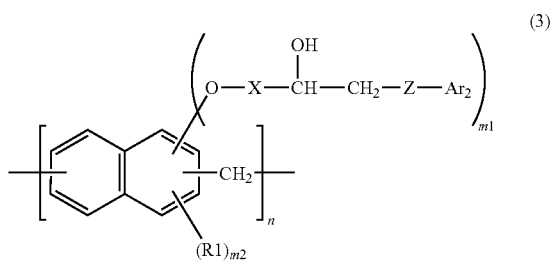
(3)

wherein X is a single bond, methylene group, $C_{2-10}$-alkylene group, a divalent hydrocarbon group having $C_{2-10}$ ether bond, or carbonyl group, Z is a linking group of —O— or —OC(=O)—, $Ar_2$ is an unsubstituted aromatic ring or an aromatic ring substituted with carboxylic acid, a carboxylic acid ester group, hydroxy group, an alkyl group, an alkoxy group, sulfonic acid group, or a halogen group, $R_1$ is a hydroxy group, an alkyl group, an alkoxy group, a halogen group, a thiol group, an amino group or an amide group, m1 is the number of A substituted on the naphthalene ring and is an integer of 1 to 6, m2 is the number of $R_1$ substituted on the naphthalene ring and is an integer of 0 to 5, a sum of m1 and m2 (m1+m2) is an integer of 1 to 6, in cases where the sum is an integer other than 6, the remainder is hydrogen atom and n is the number of repeating units ranging from 2 to 7000.

11. A coating-type underlayer coating forming composition for lithography comprising a compound of formula (4):

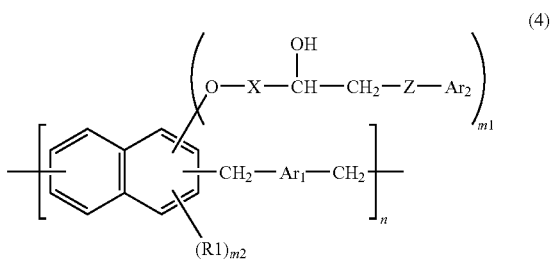
(4)

wherein X is a single bond, methylene group, $C_{2-10}$alkylene group, a divalent hydrocarbon group having $C_{2-10}$ether bond, or carbonyl group, Z is a linking group of —O— or —OC(=O)—, $Ar_2$ is an unsubstituted aromatic ring or an aromatic ring substituted with carboxylic acid, a carboxylic acid ester group, hydroxy group, an alkyl group, an alkoxy group, sulfonic acid group, or a halogen group, $Ar_1$ is a substituted or unsubstituted aromatic group, $Ar_2$ is an unsubstituted aromatic ring or an aromatic ring substituted with carboxylic acid, a carboxylic acid ester group, hydroxy group, an alkyl group, an alkoxy group, sulfonic acid group, or a halogen group $R_1$ is a hydroxy group, an alkyl group, an alkoxy group, a halogen group, a thiol group, an amino group or an amide group, m1 is the number of A substituted on the naphthalene ring and is an integer of 1 to 6, m2 is the number of $R_1$ substituted on the naphthalene ring and is an integer of 0 to 5, a sum of m1 and m2 (m1+m2) is an integer of 1 to 6, in cases where the sum is an integer other than 6, the remainder is hydrogen atom, and n is the number of repeating units ranging from 2 to 7000.

12. A coating-type underlayer coating forming composition for lithography comprising a compound of formula (5):

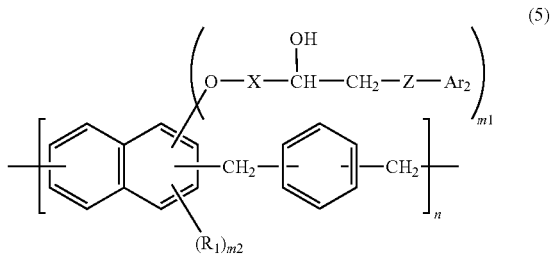
(5)

wherein X is a single bond, methylene group, $C_{2-10}$alkylene group, a divalent hydrocarbon group having $C_{2-10}$ether bond, or carbonyl group, Z is a linking group of —O— or —OC(=O)—, $Ar_2$ is an unsubstituted aromatic ring or an aromatic ring substituted with carboxylic acid, a carboxylic acid ester group, hydroxy group, an alkyl group, an alkoxy group, sulfonic acid group, or a halogen group, $Ar_2$ is an unsubstituted aromatic ring or an aromatic ring substituted with carboxylic acid, a carboxylic acid ester group, hydroxy group, an alkyl group, an alkoxy group, sulfonic acid group, or a halogen group, $R_1$ is a hydroxy group, an alkyl group, an alkoxy group, a halogen group, a thiol group, an amino group or an amide group, m1 is the number of A substituted on the naphthalene ring and is an integer of 1 to 6, m2 is the number of $R_1$ substituted on the naphthalene ring and is an integer of 0 to 5, a sum of m1 and m2 (m1+m2) is an integer of 1 to 6, in cases where the sum is an integer other than 6, the remainder is hydrogen atom and n is the number of repeating units ranging from 2 to 7000.

* * * * *